(12) United States Patent
Sakaguchi

(10) Patent No.: US 6,953,948 B2
(45) Date of Patent: Oct. 11, 2005

(54) SEMICONDUCTOR SUBSTRATE AND PROCESS FOR ITS PRODUCTION

(75) Inventor: Kiyofumi Sakaguchi, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/178,361

(22) Filed: Jun. 25, 2002

(65) Prior Publication Data

US 2003/0038383 A1 Feb. 27, 2003

Related U.S. Application Data

(62) Division of application No. 07/749,730, filed on Dec. 28, 2000, now abandoned.

(30) Foreign Application Priority Data

Jan. 7, 2000 (JP) .......................................... 2000-001478

(51) Int. Cl.⁷ .............................................. H01L 23/58
(52) U.S. Cl. .......................... 257/48; 257/347; 257/797
(58) Field of Search .......................... 257/48, 347, 797

(56) References Cited

U.S. PATENT DOCUMENTS

| | | | |
|---|---|---|---|
| 5,256,578 A | 10/1993 | Corley et al. .................. 437/8 |
| 5,371,037 A | 12/1994 | Yonehara ..................... 437/86 |
| 5,374,564 A | 12/1994 | Bruel ......................... 437/24 |
| 5,451,886 A | 9/1995 | Ogita et al. ................. 324/757 |
| 5,458,755 A | 10/1995 | Fujiyama et al. ........ 204/224 R |
| 5,466,631 A | 11/1995 | Ichikawa et al. ............. 437/62 |
| 5,532,520 A | 7/1996 | Haraguchi et al. .......... 257/797 |
| 5,821,562 A | * 10/1998 | Makita et al. ................. 257/64 |
| 5,856,229 A | 1/1999 | Sakaguchi et al. .......... 438/406 |
| 5,869,386 A | 2/1999 | Hamajima et al. .......... 438/455 |
| 5,952,694 A | 9/1999 | Miyawaki et al. .......... 257/347 |
| 6,004,405 A | * 12/1999 | Oishi et al. ................. 148/33.2 |
| 6,121,064 A | 9/2000 | Lasky et al. .................. 257/48 |
| 6,313,014 B1 | 11/2001 | Sakaguchi et al. .......... 438/475 |
| 6,350,703 B1 | 2/2002 | Sakaguchi et al. .......... 438/766 |

FOREIGN PATENT DOCUMENTS

| | | | | |
|---|---|---|---|---|
| EP | 0311087 A3 | 4/1989 | | |
| EP | 0311087 A2 | 4/1989 | | |
| EP | 0 867 917 | 9/1998 | | |
| JP | 5-211128 | 8/1993 | | |
| JP | 6-196379 | 7/1994 | | |
| JP | 7-302889 | 11/1995 | | |
| JP | 8-037 137 A | 2/1996 | .................. 257/48 |
| JP | 2608351 | 2/1997 | | |
| JP | 9-153603 | 6/1997 | | |
| JP | 11-45840 | 2/1999 | | |
| JP | 11-176708 | * 7/1999 | | |
| KR | 94-14237 | 6/1994 | | |
| TW | 395041 | 6/2000 | | |

* cited by examiner

*Primary Examiner*—Jerome Jackson
(74) *Attorney, Agent, or Firm*—Fitzpatrick, Cella, Harper & Scinto

(57) ABSTRACT

The present invention provides a semiconductor substrate comprising a semiconductor layer 3 formed on a supporting substrate 1 with interposition of an insulating layer 2 therebetween, wherein a mark is formed in a region other than a surface region of the semiconductor layer; and a process for producing the semiconductor substrate.

5 Claims, 15 Drawing Sheets

SEMICONDUCTOR SUBSTRATE AND PROCESS FOR ITS PRODUCTION

This application is a division of application Ser. No. 09/749,730, filed Dec. 28, 2000 now abandoned.

BACKGROUND OF THE INVENTION

1. Field of the Invention

The present invention relates to a semiconductor substrate for use in production of a semiconductor integrated circuit device such as semiconductor memories, microprocessors, and system LSIs; and a process for production thereof. In particular, the present invention relates to a semiconductor substrate having thereon a mark for identification of the semiconductor substrates and the like, and a process for production thereof.

2. Related Background Art

The semiconductor substrate includes mirror-wafers which are a disk-shaped substrate produced by slicing an ingot and have at least one face polished, and epitaxial wafers constituted of a mirror-wafer and a semicrystalline semiconductor layer formed on the mirror-wafer.

On the other hand, an SOI technique is widely known which forms a single-crystalline semiconductor layer on an insulator or on a substrate having an insulating layer. This product is called a silicon-on-insulator, or a semiconductor-on-insulator. The semiconductor substrate formed thereby is called an SOI substrate or an SOI wafer.

Three processes below are typical for producing SOI substrates:

(1) A SIMOX process (separation by ion-implanted oxygen) which forms an $SiO_2$ layer by oxygen ion implantation into an Si single-crystalline substrate.
(2) A smart cut process which comprises the steps of implanting hydrogen ions into an Si single-crystalline substrate, bonding another substrate, heat-treating it to grow microbubbles formed in the ion-implanted layer, and separating the Si single-crystalline substrate. The SOI substrate produced by this process is known as Unibond. The detail thereof is disclosed in Japanese Patent Application Laid-Open No. 5-211128 and its corresponding U.S. Pat. No. 5,374,564.

A modification of this process is known which comprises the steps of implanting hydrogen ions by hydrogen plasma into an Si single-crystalline substrate, bonding another substrate thereon, and applying high-pressure nitrogen gas to the side wall of the bonded substrates to separate the Si single-crystalline substrate at the ion-implanted layer.
(3) A still another process for SOI substrate production is a process for transferring a porous semiconductor layer formed on a porous body onto another substrate. This process is known to give a highest quality of the SOI substrate since the semiconductor layer can be formed by epitaxial growth on a porous body. Specific example are disclosed in Japanese Patent No. 2,608,351 and its corresponding U.S. Pat. No. 5,371,037, Japanese Patent Application Laid-Open No. 7-302889 and its corresponding U.S. Pat. No. 5,856,229, and Japanese Patent No. 2,877,800 and its corresponding EP 0,867,917. The process shown in these patent and applications is advantageous in that the thickness of the SOI layer is uniform, crystal defect density can readily be decreased, the surface of the SOI layer has a good flatness, the equipment for the production is inexpensive, a wide range of the SOI film thickness from several hundred Å to about 10 $\mu$m can be produced with one equipment, and so forth.

When wafers pass through the production step of semiconductor integrated circuit devices (device step), it is preferable that the wafers are identified individually. The identification of the wafers is highly effective in managing the step history of the individual wafers, and is utilized in failure analysis, optimization of the step, production control, and so forth. The identification of mirror wafers can be conducted using a mark formed on the wafer surface with a laser beam.

FIG. 18 shows a cross section of a wafer after thus laser marking. The region of the surface of the wafer irradiated with laser beam is melted to become a recessed portion, and the wafer material repelled out from the recessed portion by melting solidifies on the periphery of the recessed portion in a shape of a somma as shown in FIG. 18. For example, in the case where the laser having a power of 220 mW is applied in dot onto the surface of a silicon wafer, the maximum diameter X1 of the deformed region ranges from 0.04 mm to 0.05 mm, the diameter X2 of the recessed portion at the center ranges from 0.02 mm to 0.03 mm, the depth Y1 of the recessed portion ranges from 2 $\mu$m to 3 $\mu$m, and the height Y2 of the protruded portion ranges from 0.5 $\mu$m to 1.0 $\mu$m. These dimensions vary depending on the laser power. In practice, laser beam is applied in pulse to form many dots partially overlapped or separately, thereby picturing a mark. The wafer material to be the somma may be disappear. It is possible that the mark without the somma is formed by adjusting laser power, laser frequency or shot counts of laser. Shallow mark with somma may be formed by low power laser. High power laser forms deep mark without somma by scattering or spreading the material to be the somma. The mark on the mirror wafer is usually constituted from about 10 alphanumerical characters, and denotes a specific ID number of each of the wafers. This is a normal method which is prescribed by the International Standard of SEMI.

Such a laser marking method is assumed for usual Si mirror wafers, and the marking position is also prescribed in the SEMI Standard.

FIG. 19 is a top view of a mirror wafer 21 having a mark formed thereon, and FIG. 20 is a sectional view of the mirror wafer 21 at and around the mark. For example, in a 8-inch wafer as shown in FIG. 19 with a notch 12 placed upward, taking the center 100 of the wafer as the origin (0,0) of an x-y coordinate, the aforementioned SEMI Standard prescribes that a mark 4 should be formed in a marking region 24 where X ranges from −9.25 to +9.25 mm, Y ranges from +93.7 to +96.5 mm, that is, in a rectangular region 24 in the height L2 being 2.8 mm, the length L1 being 18.5 mm.

If this standard is applied to the SOI wafer, the marking range comes to the surface region of the semiconductor layer (SOI layer) on the insulating layer.

FIG. 21 is a top view of an SOI wafer having the mark formed thereon. FIG. 22 is a sectional view at and around the mark. The laser output level and other conditions of the laser are prescribed for Si mirror wafers not to cause splash of particles. Therefore, in the marking on an SOI wafer according to the above SEMI standard, particles are generated and a dot diameter changes in some cases due to its multilayer structure and the action of a heat-accumulating layer of $SiO_2$.

In the case of deep mark, change of dot diameter is more seriously. FIG. 23 shows schematically this state. For example, in the case where a laser beam is projected onto an SOI wafer having an SOI layer of 100 to 200 nm thick, a buried insulating layer of 100 to 200 nm thick under the same laser irradiation conditions as in the case of FIG. 18, the diameter X1 of the inner protruded portion is about 0.045 mm, the diameter X2 of the recessed portion is about 0.04 mm, the distance X3 between the inner protruded portion and the outer protruded portion ranges from 0.02 to 0.03 mm, the depth Y1 of the recessed portion ranges from 2.5 to 3.0 μm, the height Y2 of the inner protruded portion ranges from 1.0 to 1.5 μm, and the height Y3 of the outer protruded portion ranges from 0.8 to 1.5 μm. Incidentally, the depth Y1 of the recessed portion, and the heights Y2 and Y3 are indicated as approximate values.

In formation of the mark on the SOI layer surface, it is observed that the recessed portion constituting marked characters becomes bold and particles 25 are splashed around the characters, as shown in FIG. 23. The conditions of not causing the splashing of particles depend on the SOI layer structure and the thickness of the respective layers, so that the setting conditions therefor are complicated and laborious. Furthermore, when the laser has a lower output level that the particle splashing is retarded, the depth of the recessed portion formed by the laser irradiation becomes smaller, thereby rendering the reading of the mark difficult.

SUMMARY OF THE INVENTION

An object of the present invention is to provide a semiconductor substrate which has a readable mark and can be easily marked without causing deposition of splashed particles, and to provide also a process for producing the semiconductor substrate.

According to an aspect of the present invention, there is provided a semiconductor substrate having a semiconductor layer formed on a supporting substrate with interposition of an insulating layer therebetween, wherein a mark is formed on a region other than a surface region of the semiconductor layer.

According to another aspect of the present invention, there is provided a process for producing a semiconductor substrate having a semiconductor layer formed on a supporting substrate with interposition of an insulating layer therebetween, the process comprising a step of forming a mark on a region other than a surface region of the semiconductor layer.

According to still another aspect of the present invention, there is provided a semiconductor substrate having a semiconductor layer formed on a supporting substrate with interposition of at least one layer therebetween, wherein a mark is formed on a region other than a surface region of the semiconductor layer.

According to a further aspect of the present invention, there is provided a process for producing a semiconductor substrate having a semiconductor layer formed on a supporting substrate with interposition of at least one layer therebetween, the process comprising a step of forming a mark on a region other than a surface region of the semiconductor layer.

DETAILED DESCRIPTION OF THE PREFERRED EMBODIMENTS

I. Constitution of Semiconductor Substrate

Embodiments of the semiconductor substrate according to the present invention is described below.

Embodiment 1

Figure 1:
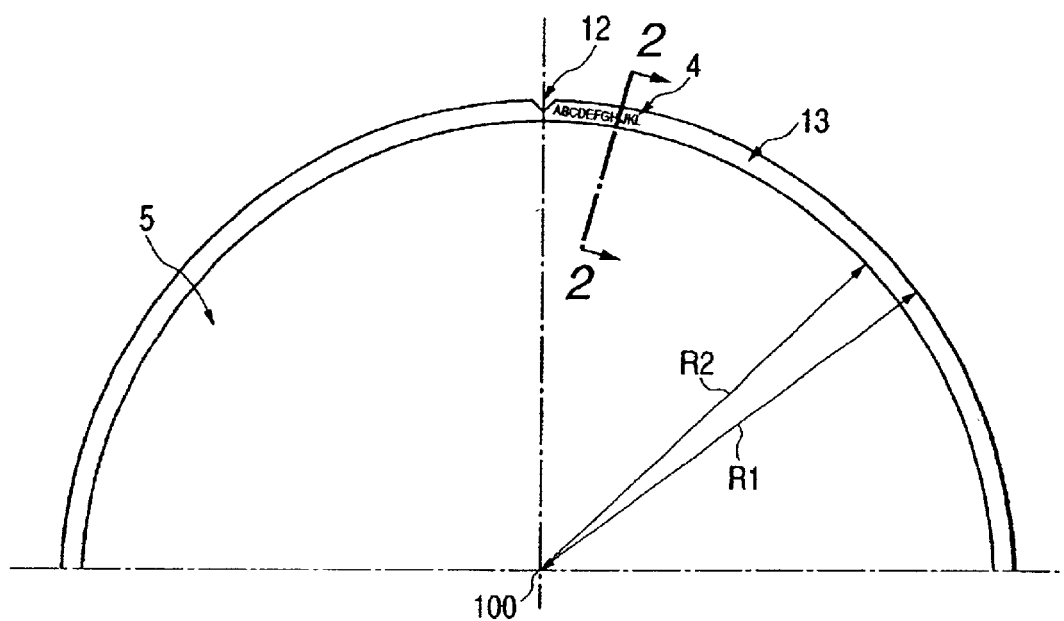
FIG. 1 is a top view of a part of a semiconductor substrate according to an embodiment of the present invention.
Figure 2:
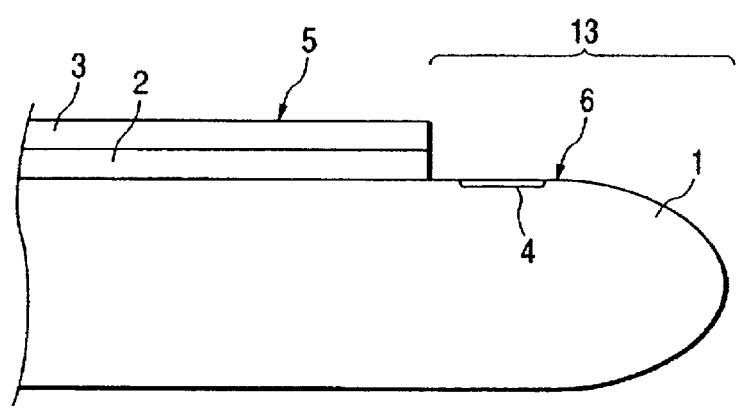
FIG. 2 is a sectional view of a part of a semiconductor substrate according to an embodiment of the present invention.

FIG. 1 is a top view of a part of a semiconductor substrate according to the present invention. FIG. 2 is a cross-sectional view of the semiconductor substrate taken along the line 2—2 of FIG. 1.

An SOI substrate is constituted of a supporting substrate 1 such as a single-crystalline silicon wafer, a buried insulating layer 2 such as of silicon oxide, and a semiconductor layer (SOI layer) 3 such as a single-crystalline silicon layer.

In a surface region 5 of the semiconductor layer 3, a semiconductor device for an integrated circuit and the like is formed. A mark 4 is formed in a region 6 which is a nearly flat region of the surface of peripheral region 13 of the semiconductor substrate. The substrate has a notch 12.

The edge of the surface region 5 of the SOI layer 3 (i.e., inside border line of the peripheral region) is indicated by the circle of a radius R2. The outer peripheral edge (outside border line of the peripheral region) of the substrate is indicated by the circle of a radius R1. The region between the circle of the radius R2 and the circle of the radius R1 is the peripheral region 13.

In more detail, general SOI wafers available at present usually have a region having a width of several millimeters inward from the outer peripheral edge of the wafer, in which a device is not formed. This region is called "edge exclusion".

In a SIMOX, for example, the SOI layer in the region having a width of several millimeters inward from the outer peripheral edge may have a thickness of an off-specification or other detects caused by the nonuniformity of ion implantation.

In a bonding SOI wafer, a region having a width of several millimeters from the outer peripheral edge of a wafer is not bonded owing to sagging of the peripheral portion of an original wafer as a starting material, whereby the region has no SOI structure. Further, since the edge line of the SOI layer is not smooth, patterning is sometimes conducted to remove a part of the SOI layer to bring artificially the edge thereof inward.

In marking on such an SOI wafer, the mark should be formed on a region having no SOI structure. Therefore, on bonded wafers having no SOI layer in the peripheral region, the marking is conducted on the peripheral region 13 as shown in FIGS. 1 and 2. This method is advantageous in that the marking can be conducted in a less number of the steps and that the number of the chips obtainable in the SOI region is not decreased, in comparison with the SOI layer removal method.

Embodiment 2

Figure 3:
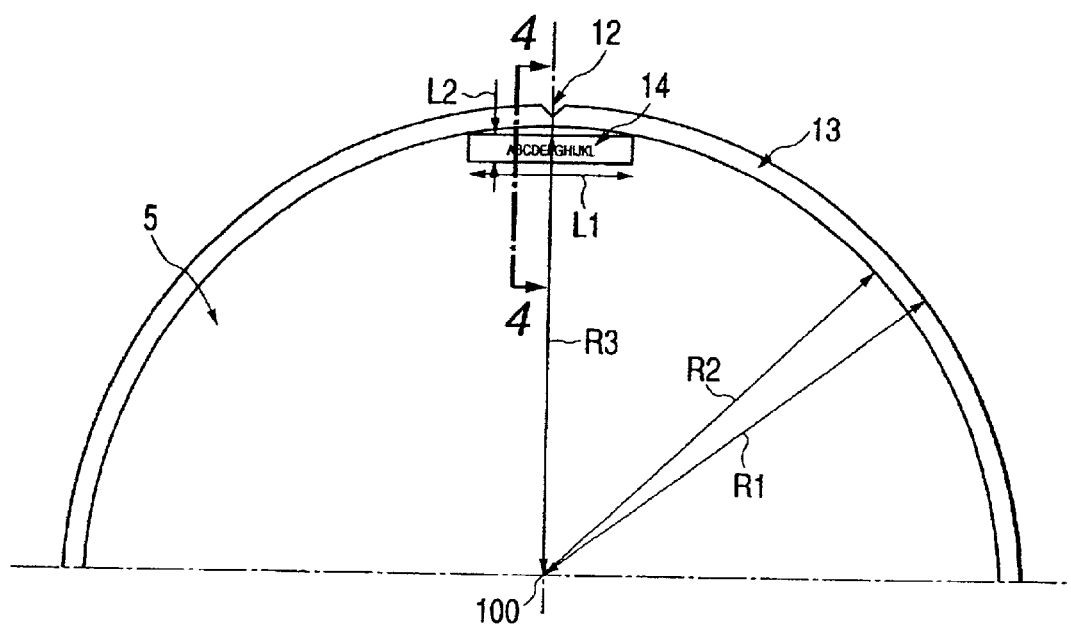
FIG. 3 is a top view of a part of another semiconductor substrate according to an embodiment of the present invention.
Figure 4:
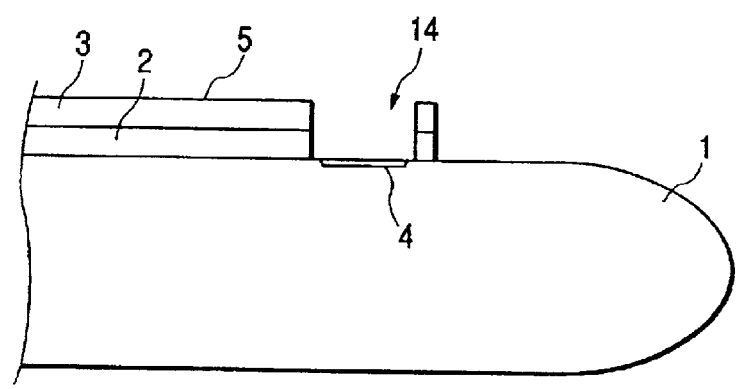
FIG. 4 is a sectional view of a part of another semiconductor substrate according to an embodiment of the present invention.

FIG. 3 is a top view of a part of a semiconductor substrate according to the present invention. FIG. 4 is a cross-sectional view of the semiconductor substrate taken along the line 4—4 of FIG. 3.

A semiconductor layer (SOI layer) 3 and a insulating layer 2 are partially hollowed and removed to form an exposed region 14, where a part of the supporting substrate 1 is exposed, inside the edge of the semiconductor layer 3, namely on a region (internal region) excluding the peripheral region 13 from the supporting substrate 1.

The mark 4 is made on this exposed region 14. Although in FIG. 3 the mark 4 is constituted of alphabets, the mark 4 may be a bar code, a numeral, a character, a symbol, or combination thereof.

The edge (inside border line of the peripheral region) of the surface region 5 of the SOI layer 3 is shown by a circle line of radius R2. The outer peripheral edge (outside border line of the peripheral region) of the substrate is shown by the circle of a radius R1. In this Embodiment, the mark is formed inside the circle of a radius R2.

The semiconductor substrate according to this Embodiment is produced through the steps of preparing a semiconductor substrate such as an SOI wafer, masking the semiconductor substrate except the region for formation of the exposed region 14, removing the portion of the semiconductor layer 3 from the region not masked for exposed region formation by etching or the like, removing the underlying insulating layer 2 by etching or the like to expose the surface of the semiconductor, and forming a mark by laser irradiation or the like on the exposed region 14, whereby an SOI substrate is obtained as shown in FIGS. 3 and 4.

Embodiment 3

In this Embodiment, the mark is formed on the back surface of the supporting substrate.

Figure 19:
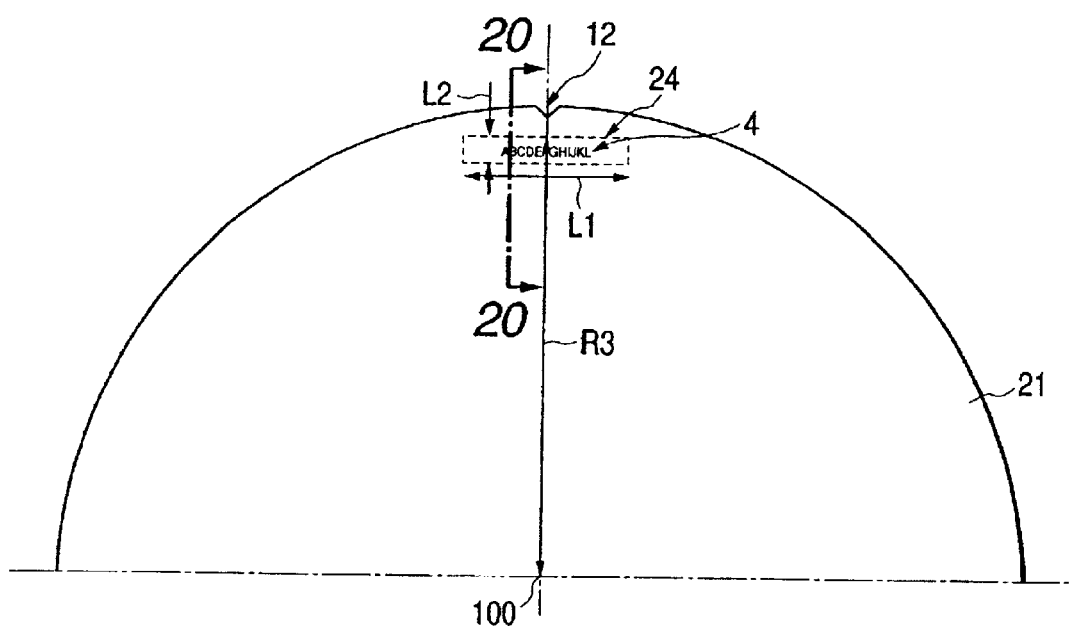
FIG. 19 is a top view of a part of a semiconductor substrate.
Figure 20:
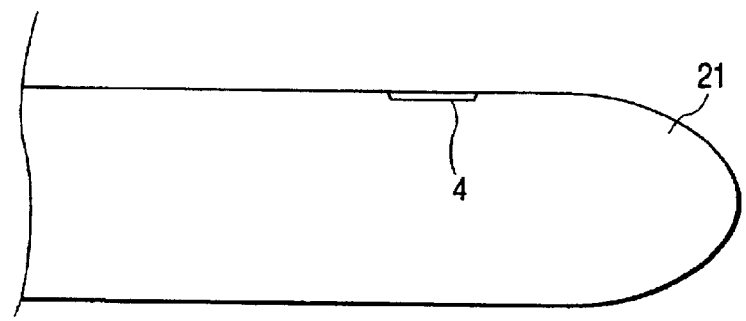
FIG. 20 is a cross-sectional view of a part of a semiconductor substrate.
Figure 21:
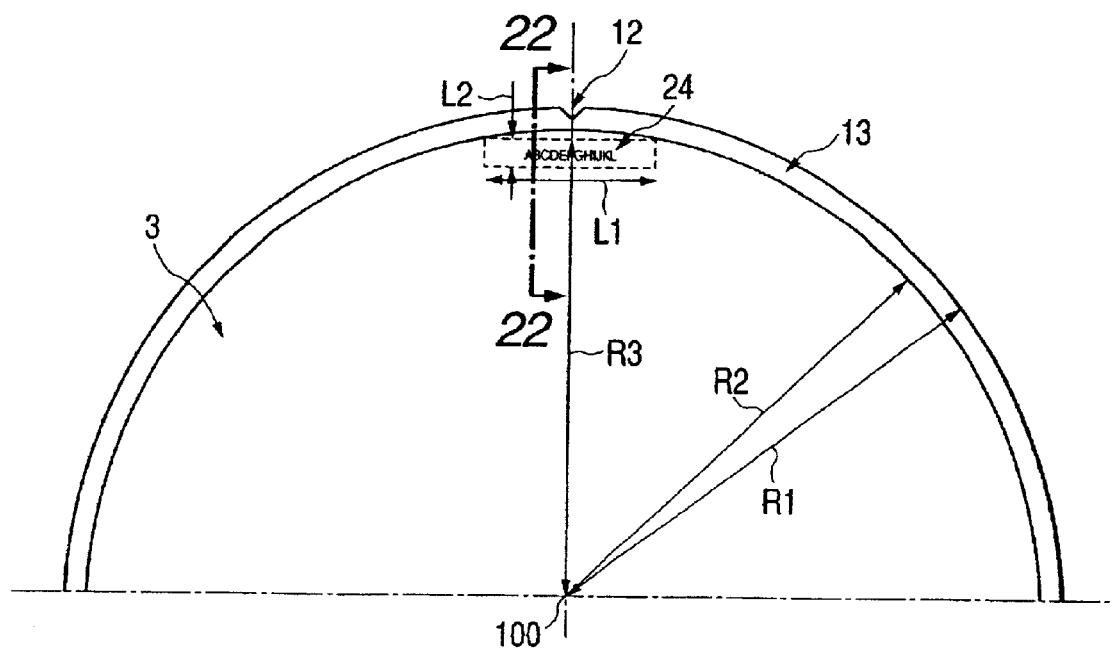
FIG. 21 is a top view of a part of an SOI substrate.
Figure 22:
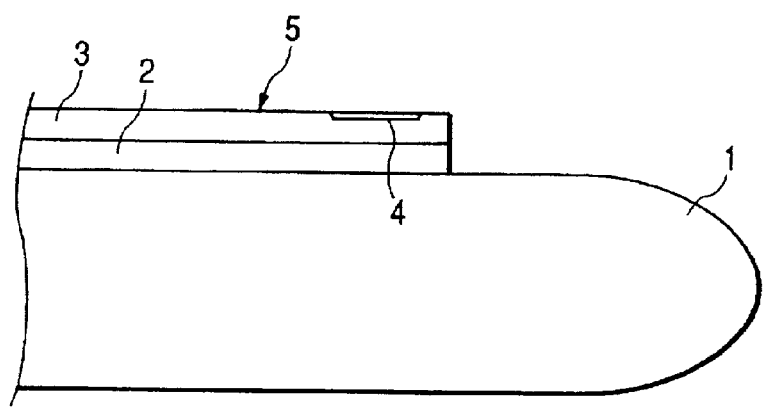
FIG. 22 is a cross-sectional view of a part of an SOI substrate.
Figure 23:
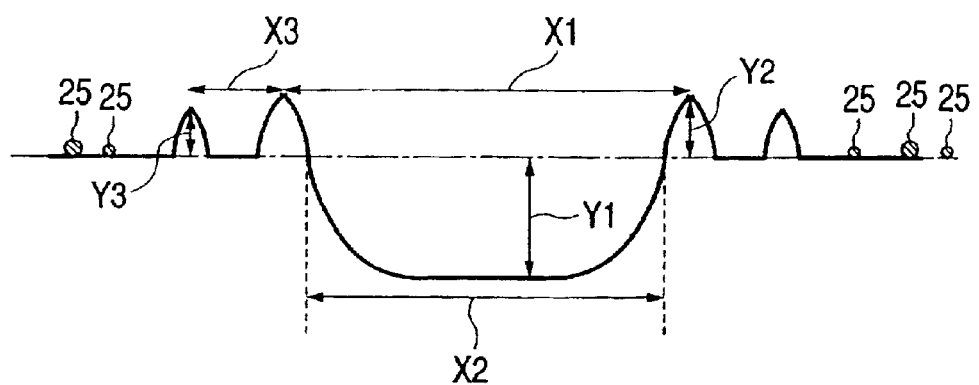
FIG. 23 is a cross-sectional view showing the shape of a laser mark.

In this Embodiment, the mark is formed on the back surface of a supporting substrate of the SOI substrate in the same manner as the marking on the front surface of a mirror wafer as shown in FIGS. 19 and 20.

Since the mark is made on the back surface of the supporting substrate, the effective area of the SOI layer on the front surface of the supporting substrate is not decreased.

Embodiment 4

Figure 5:
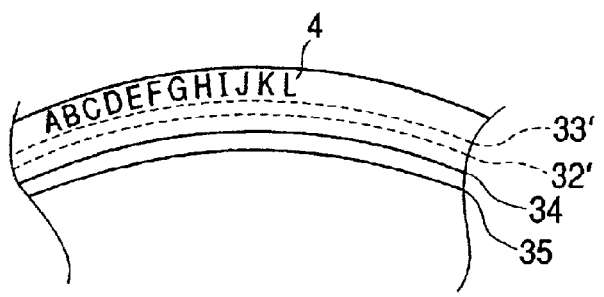
FIG. 5 is a top view of a part of a semiconductor substrate according to an embodiment of the present invention.
Figure 6:
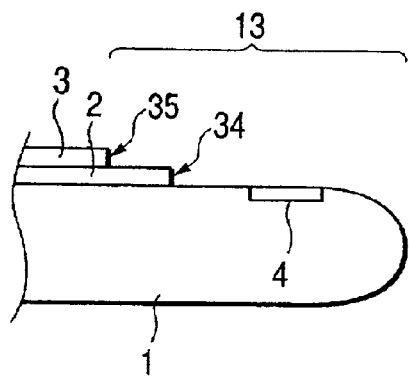
FIG. 6 is a sectional view of a part of a semiconductor substrate according to an embodiment of the present invention.

FIGS. 5 and 6 illustrate the structure of the peripheral region marked and its vicinity in a semiconductor substrate.

FIG. 5 is a top view of the peripheral region and its vicinity. FIG. 6 is a sectional view of the peripheral region and its the vicinity.

Numeral 34 denotes an edge of a buried insulating layer 2. Numeral 35 denotes an edge of SOI layer 3. In this Embodiment, the edge 34 of the insulating layer 2 is extended to the outside of the edge 35 of the SOI layer 3. Thereby, under-etching of the insulating layer 2 by cleaning or the like with a cleaning solution having an etching property can be prevented to retard chipping of the SOI layer. However, this is not essential. More preferably, the corner of the SOI layer 3 or of the buried insulating layer 2 may be worked to round it off or to make the angle obtuse.

The mark 4 is formed in an outer part in the peripheral region 13. In FIG. 5, the mark 4 is made outside an imaginary line 33'.

Figure 7:
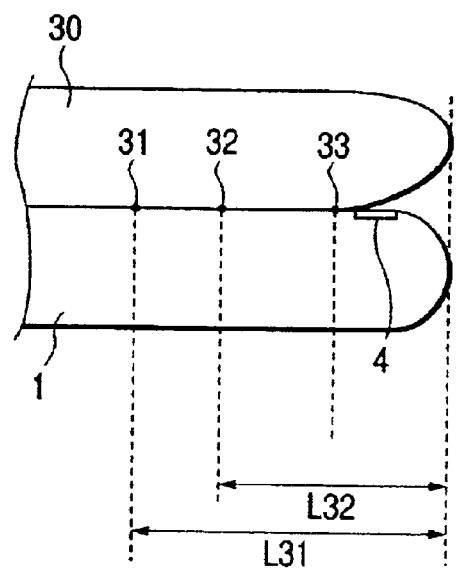
FIG. 7 is a sectional view of a part of bonded substrates according to an embodiment of the present invention.

The imaginary line 33' is explained by reference to FIG. 7. FIG. 7 is a sectional view of bonded substrates produced by bonding two substrate for preparing a bonding SOI substrate. In FIG. 7, the mark 4 is made outside the position indicated by the numeral 33. The mark 4 is formed on a flat surface of the peripheral region 13. The flat surface is not contacted with the wafer 30. A part of the mark 4 may be formed on a bevelled surface of the peripheral region. In the bonded state of the two substrates, the edge of the bonding interface is at the position indicated by the numeral 32, which position is called "contact edge". Thereafter, the bonded substrates are heat-treated (or bonding-annealed) to increase the bonding strength of the substrates, whereby the edge of the bonding interface moves outward to the position indicated by the numeral 33 to increase the area of the bonding interface.

Later, the unnecessary portion of the substrate 30 is removed to make the substrate 30 thinner to obtain the SOI substrate. On the surface of the supporting substrate 1 of the resulting SOI substrate, the original position of the bonding edge 33 is indicated by the imaginary line 33', and the original position of the contact edge 32 is indicated by the imaginary line 32'.

Numeral 31 shows an intended position corresponding to the edge 35 of the completed SOI layer 3. The distance L31 from the outer peripheral edge of the supporting substrate 1 is preferably not more than 3 mm, more preferably as small as possible in a range of 3 mm or less.

The position of the contact edge 32 is determined depending on the shape of the outer peripheral portion of the used substrates 1 and 30 after beveling: the distance L32 between the outer peripheral edge of the supporting substrate 1 and the contact edge 32 varies depending on the beveled shape of the outer peripheral portion. Similarly the bonding edge 33 is shifted slightly.

If roughness or a foreign particle is present in the vicinity of the contact edge 32 of the substrate-bonding face, the bonding is difficultly carried out in the vicinity to cause slight inward shifting of the contact edge 32 as well as of the bonding edge 33. In such a case, the edge of the strongly bonded region is moved inward, which forces the edge 35 of the SOI layer 3 to move inward to a position where a sufficient bonding strength can be achieved, thereby preventing shortening of the distance L31.

The mark in the present invention can be formed at a portion between the outer peripheral edge of the supporting substrate and the edge of the SOI layer, more preferably outside the position 32' corresponding to the contact edge 32. Also preferably, the mark is formed outside the position 33' corresponding to the bonding edge 33.

Preferably also, only the portion of the bonding edge 33 or the contact edge 32 for mark formation is moved inward locally and the mark is made thereon without decreasing the effective area of the SOI layer.

Embodiments of the semiconductor substrate according to the present invention are explained above. The present invention is not limited thereto, and includes substitution of the constituting element to an equivalent provided that the objects of the present invention can be achieved.

The supporting substrate useful in the present invention may be a semiconductor substrate of Si, Ge, SiC, GaAs, GaAlAs, GaN, InP, or the like, but is not limited thereto, provided that a mark can be formed on the surface thereof.

The insulating layer useful in the present invention may be composed of at least one of silicon oxide, silicon nitride, silicon oxide nitride, and the like. The insulating layer may be constituted of a single layer or a lamination of plural layers. The thickness of the insulating layer may be in the range from 1 nm to 10 $\mu$m.

The semiconductor layer useful in the present invention is formed from at least one semiconductor including Si, Ge, SiC, GaAs, GaAlAs, GaN, InP and the like. The semiconductor layer may be of a single layer or a lamination of plural layers. The thickness of the semiconductor layer may be in the range from 1 nm to 10 $\mu$m.

The shape of the semiconductor substrate of the present invention is not limited to the notched wafer as shown in FIG. 1, but may be other shape of a wafer such as a wafer having an orientation flat. The SOI substrate for use in the present invention may be a nonbonding substrate such as a SIMOX wafer, but is preferably a bonding SOI substrate.

The region for the marking may be near the notch or the orientation flat, or at the position opposing thereto, or may be at any other position.

The mark is formed in the peripheral region as mentioned above. Preferably, the mark is formed therein on a flat portion or slightly inclined portion formed by beveling. Otherwise, the mark may be formed on a portion exposed by partial removal of the semiconductor layer.

The marking can be conducted by Nd:YAG laser, $CO_2$ lager, or the like, or by use of a diamond pen.

The mark may be constituted of at least one of numerals, characters, symbols, and bar codes, and the like, or combination thereof. The characters include alphabet, Japanese kana, and Greek characters.

For a special use, the SEMI standard need not be applied. The numerals, characters, symbols, and the like for constituting the mark may be arranged in a line or in a curve along the outer peripheral edge of the wafer. In the case where the peripheral region formed by removal of the semiconductor layer is narrow, or where the number of digits of the mark is large, the mark is preferably arranged in a curve along the outer peripheral edge not to interfere the SOI layer.

The marked wafers may be packed up and shipped without further treatment, or may be packed up after washing or inspection and shipped. Otherwise, the marked wafers may be introduced to a device production step without treatment or after cleaning or inspection.

II. Process for Producing Semiconductor Substrate

Embodiments of the process is described below for producing the above semiconductor substrate according to the present invention.

The process for producing the semiconductor substrate according to the present invention comprises the steps of preparing a semiconductor substrate having a semiconductor layer formed on a supporting substrate with interposition of an insulating layer therebetween, and forming a mark on a region other than the surface region of the semiconductor layer.

The semiconductor substrate useful in the present invention is described above. The preferred semiconductor substrate includes nonbonding SOI substrates having an insulating layer formed by oxygen and/or nitrogen ion implantation and heat treatment; bonding SOI substrates produced by ion-implanting hydrogen and/or inert gas onto a first substrate, bonding the first substrate to a second substrate as a supporting substrate, and separating the bonded substrates at a separation layer having been formed by the above ion implantation; and bonding SOI substrates having a semiconductor layer formed by transferring a nonporous semiconductor layer formed on a porous layer onto a supporting substrate.

Another process for producing the semiconductor substrate according to the present invention comprises a step of marking on a supporting substrate such as a so-called handle wafer before formation of an SOI structure.

Embodiment 5

A process for producing a semiconductor substrate is explained with reference to FIGS. 8A to 8F and 9.

A first substrate 30 such as a single-crystalline silicon wafer is anodized to form a porous layer 37 such as a porous silicon layer on the surface. Further, if necessary, the inside wall of the pores of the porous silicon is thermally oxidized to form a protective silicon oxide film. Then the openings on the surface of the porous layer 37 are sealed by heat treatment in a hydrogen atmosphere.

Figure 8A:
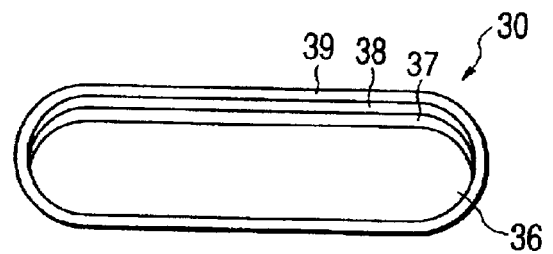
FIGS. 8A, 8B, 8C, 8D, 8E and 8F are sectional views explaining production steps of a semiconductor substrate according to an embodiment of the present invention.

On the porous layer 37, a nonporous semiconductor layer 38 such as a single-crystalline silicon layer is formed by epitaxial growth by CVD or the like. This semiconductor 38 layer is a layer to be transferred, that is, becomes a transferred layer. Further, if necessary, an insulating layer 39 is formed by thermal oxidation of the first substrate 30. Thus a structure as shown in FIG. 8A is produced through the steps S11 and S12 in FIG. 9.

Then a second substrate such as a single-crystalline silicon wafer is prepared in the step S21. Marking is conducted on the surface of the peripheral portion thereof in the step S22. If necessary, the surface of the second substrate may be thermally oxidized to form an insulating layer. Otherwise, the marking may be made on the back surface of the second substrate at its any position. Primary process for producing a single-crystalline silicon wafer comprises the steps of slicing a silicon ingot, lapping, etching and polishing. Deep mark is formed prior to lapping or etching. Shallow mark is formed prior to polishing.

Figure 8B:
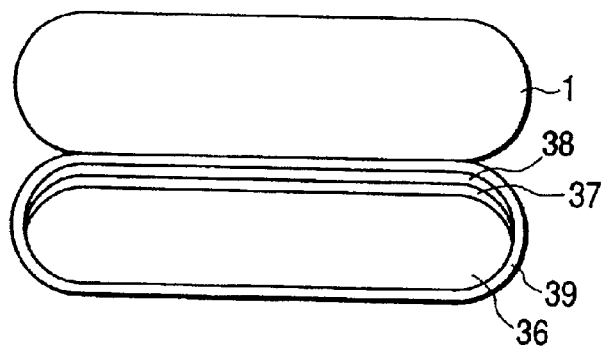

The two substrates are bonded together in the step S13 as shown in FIG. 8B. The strength of the bonding may be increased by heat treatment in an oxidative atmosphere or the like. In the case where the marking is conducted on the front surface, the mark is preferably formed outside the contact edge or outside the bonding edge in the step S13.

Figure 8C:
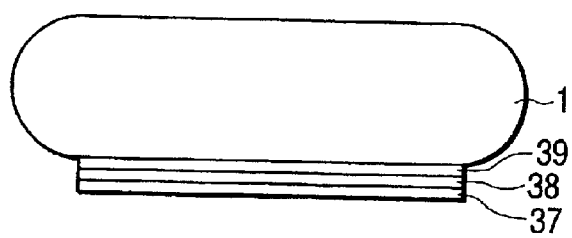

In the step S14, the unnecessary portion of the first substrate is removed. Specifically, as shown in FIG. 8C, the nonporous portion 36 of the back surface side of the first substrate is removed from the bonded substrates by at least one of the methods of grinding, polishing, etching, and separation. Then, the porous layer 37 remaining on the surface (formerly the back surface) of the semiconductor 38 bonded to the second substrate is removed by polishing, etching, or hydrogen annealing, or is made nonporous. Thus the transfer of the semiconductor layer 38 is completed.

Figure 8D:
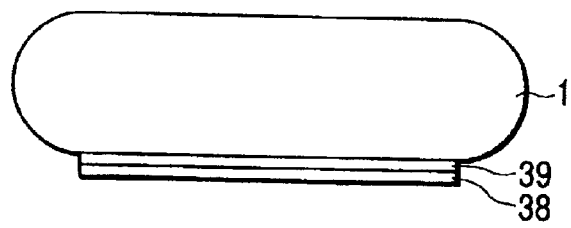
Figure 8E:
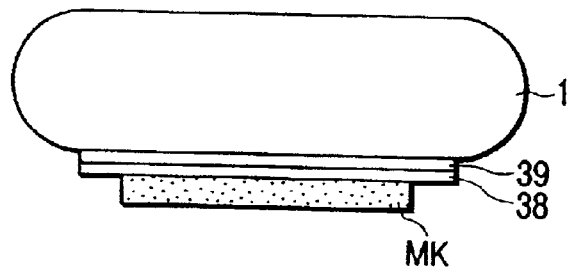

In the step S15, the peripheral portion of the SOI substrate is formed. Specifically, as shown in FIG. 8E, the exposed surface of the semiconductor layer 38 is covered by an etching mask of a sealing material, photoresist, or the like. Then the peripheral portion of the semiconductor layer 38 is removed by etching so that the edge of the semiconductor layer 38 for forming the SOI layer is brought to the position 31 shown in FIGS. 5 to 7. Further, the peripheral portion of the insulating layer 39 is also removed by etching or polishing.

Figure 8F:
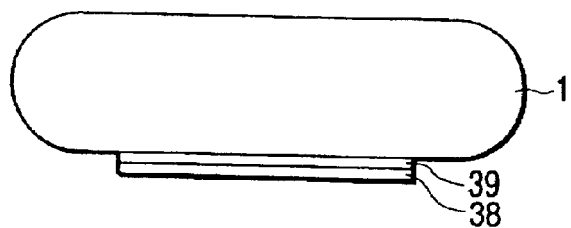
Figure 9:
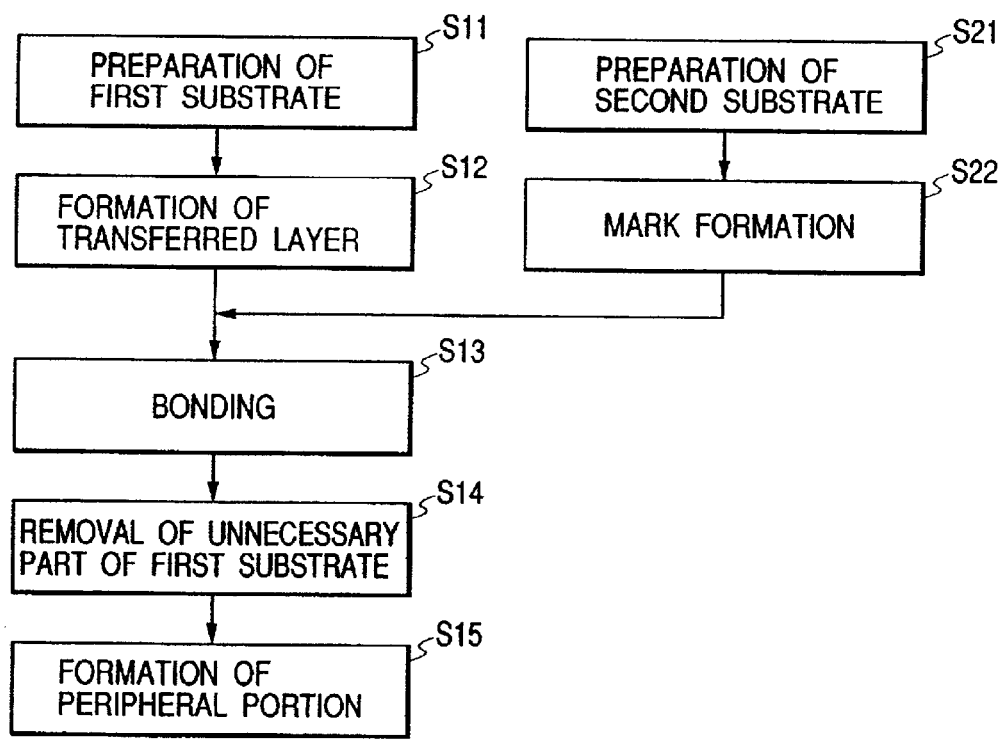
FIG. 9 is a flow chart of production steps of a semiconductor substrate according to an embodiment of the present invention.

In such a manner, an SOI substrate is prepared as shown in FIG. 8F. The mark on the SOI substrate is formed at the position shown in FIGS. 1, 2, 5 and 6.

Embodiment 6

Figure 10:
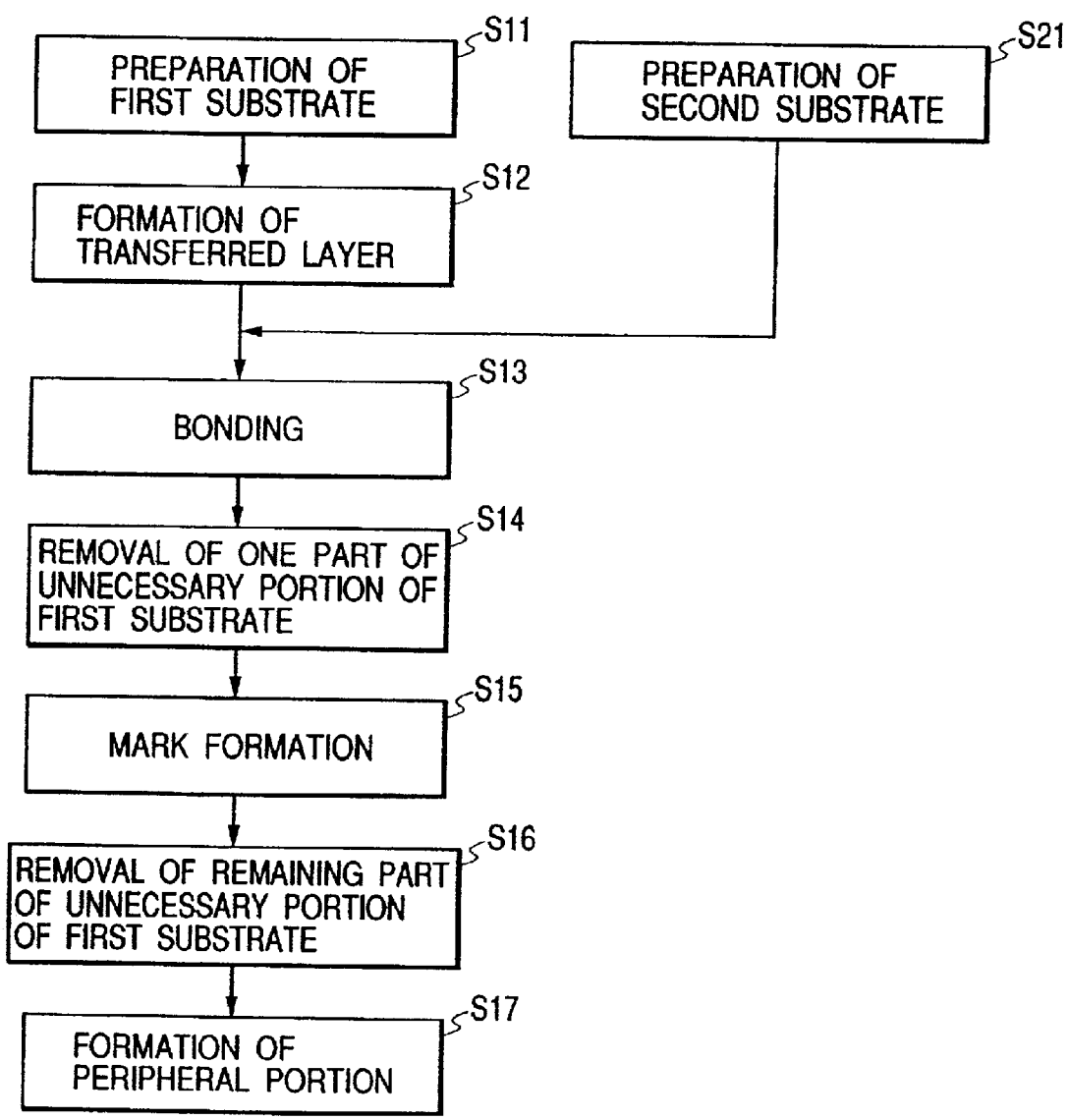
FIG. 10 is a flow chart of production steps of a semiconductor substrate according to an embodiment of the present invention.

Another process for producing a semiconductor substrate is explained with reference to FIG. 10.

This Embodiment is different from the above Embodiment 5 in that the marking is conducted between the steps of removing unnecessary portions of the first substrate.

In the same manner as in Embodiment 5, a first substrate after the steps S11 and S12 is bonded to an unmarked second substrate (Step S13).

In the step S14, a part of the unnecessary portions of the first substrate is removed. Specifically, as shown in FIG. 8C, the nonporous portion 36 on the back surface side of the first substrate is removed by at least one of the methods of grinding, polishing, etching, and separation.

Then in the step S15, the marking is conducted at the peripheral portion of the front surface side of the second substrate. Even if foreign matters splashed by the marking deposit onto the front surface of the second substrate, the splashed matters are removed from the front surface in the subsequent step of removing the porous layer 37. Therefore, the surface region of the semiconductor layer for forming the SOI layer is not soiled with the foreign matter. Otherwise, the marking may be conducted on the back surface side of the second substrate.

In the subsequent step of S16, the porous layer 37 remaining on the surface (formerly the back surface) of the semiconductor layer 38 bonded to the second substrate is removed by polishing, etching, or hydrogen annealing, or is made nonporous. Thus the transfer of the semiconductor layer 38 is completed.

Then in the step S17, the peripheral portion of the SOI substrate is formed.

In such a manner, an SOI substrate is obtained as shown in FIG. 8F. The mark on the SOI substrate is formed at the position as shown in FIGS. 1, 2, 5 and 6.

Embodiment 7

Figure 11:
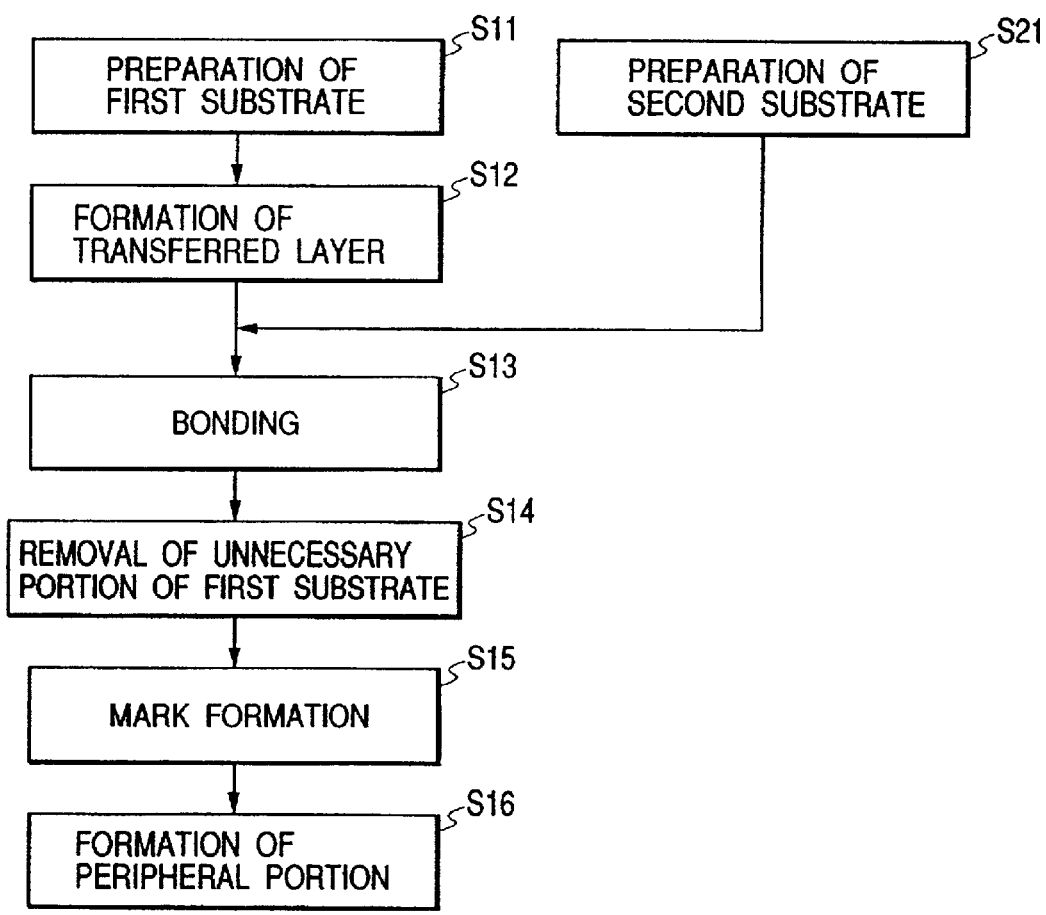
FIG. 11 is a flow chart of production steps of a semiconductor substrate according to an embodiment of the present invention.

Still another process for producing a semiconductor substrate is explained with reference to FIG. 11.

This Embodiment is different from the above Embodiment 5 in that the marking is conducted after the step of removing unnecessary portions of the first substrate and before the step of formation of peripheral portion.

In the same manner as in Embodiment 5, a first substrate after the steps S11 and S12 is bonded to an unmarked second substrate (Step S13).

In the step S14, a part of the unnecessary portion of the first substrate is removed. Specifically, as shown in FIG. 8C, the nonporous portion 36 on the back surface side of the first substrate is removed by the methods of grinding, polishing, etching, separation, or the like. Then, as shown in FIG. 8D, the porous layer 37 remaining on the surface (formerly the back surface) of the semiconductor layer 38 bonded to the second substrate is removed by polishing, etching, or hydrogen annealing, or is made nonporous. Thus the transfer of the semiconductor layer 38 is completed.

In some cases in the above-mentioned separation of the nonporous portion, the interface between the porous layer and the semiconductor layer 38 may be cracked, thereby allowing the porous layer to be separated together with the nonporous portion from the semiconductor layer 38. After this separation, in some cases, there is no remaining porous layer on the semiconductor layer 38.

Then, in the step S15, the marking is conducted at the peripheral portion of the front surface side of the second substrate with a mask MK covering the surface region of the semiconductor 38, as shown in FIG. 8E. In the marking, even if foreign matters splashed by the marking operation deposit onto the front surface of the second substrate, the splashed matters are removed in the subsequent step of removing the mask MK from the front surface side. Therefore, the surface region of the semiconductor layer for forming the SOI layer is not soiled by foreign matters. Otherwise, the marking may be conducted on the back surface side of the second substrate.

In the subsequent step S16, the peripheral portion of the SOI substrate is formed using the mask MK.

In such a manner, an SOI substrate is obtained as shown in FIG. 8F. The mark on the SOI substrate is formed at the position as shown in FIGS. 1, 2, 5 and 6.

Embodiment 8

Figure 12:
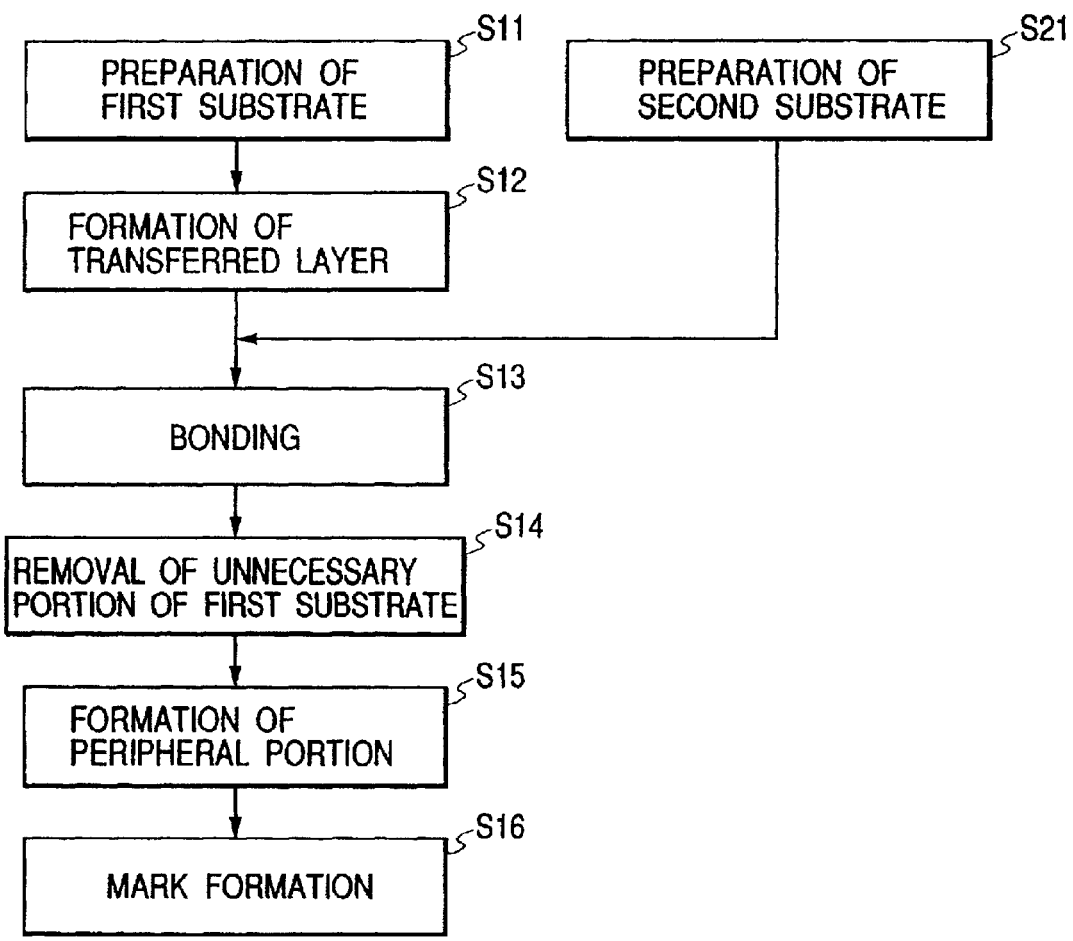
FIG. 12 is a flow chart of production steps of a semiconductor substrate according to an embodiment of the present invention.

A further process for producing a semiconductor substrate is explained with reference to FIG. 12.

This Embodiment is different from the above Embodiment 7 in that the marking is conducted after formation of the peripheral portion with the mask MK kept covering in the same manner as in Embodiment 7 and without peeling the mask MK.

Thus in this Embodiment, an SOI substrate is also prepared as shown in FIG. 8F. The mark on the SOI substrate is formed at the position shown in FIGS. 1, 2, 5 and 6.

Embodiment 9

A process for producing a bonding semiconductor substrate is explained which employs an ion-implanted layer as a separation layer, with reference to FIGS. 13A to 13F.

Figure 13A:
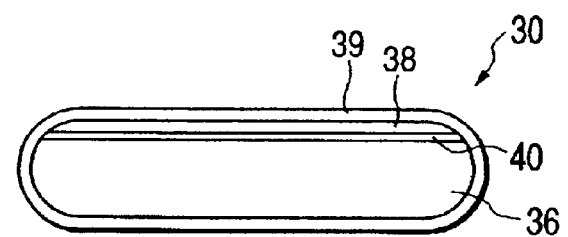
FIGS. 13A, 13B, 13C, 13D, 13E and 13F are sectional views explaining production steps of a semiconductor substrate according to an embodiment of the present invention.

A first substrate 30 such as a single-crystalline silicon wafer is thermally oxidized at the surface to form an insulating layer 39 such as a silicon oxide layer. Thereto, inert gas ions such as hydrogen ions, helium ions, and neon ions are implanted to a predetermined depth to form an ion-implanted layer 40 where the concentration of the implanted ions is locally high. The portion positioned on the ion-implanted layer 40 is a layer to be transferred, that is, becomes a transferred layer. FIG. 13A shows the structure of the first substrate 30 thus obtained.

Separately, a second substrate such as a single-crystalline wafer is prepared. A marking is conducted on the peripheral portion of the front surface, or the marking may be conducted on the back surface side of the second substrate.

Figure 13B:
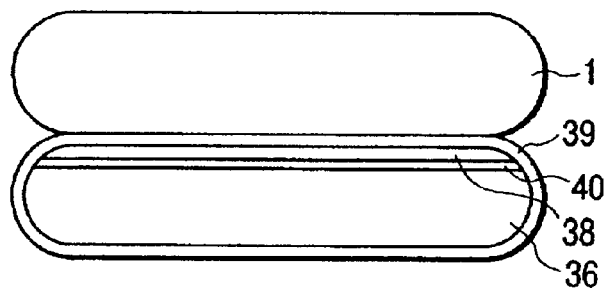

The first substrate and the second substrate are bonded together so that the semiconductor layer 38 is placed inside, thereby obtaining a structure as shown in FIG. 13B.

Figure 13C:
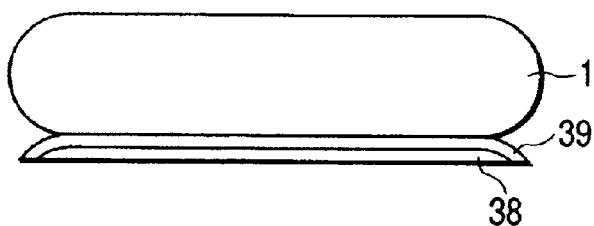

The bonded substrates are then heat-treated at a temperature ranging from 400 to 600° C. or higher to increase the bonding strength and simultaneously cause cracking in the ion-implanted layer 40. Thereby the portion 36 of the first substrate comes off from the bonded substrates, and the semiconductor layer 38 is transferred onto the second substrate as shown in FIG. 13C.

The exposed separation surface of the semiconductor layer 38 is polished. In this step, the peripheral portions of the layers 38 and 39 may be removed simultaneously to obtain the structure shown in FIG. 13D. Otherwise, hydrogen annealing may be conducted instead of the polishing, or the polishing and the hydrogen annealing are successively conducted. It is preferable that annealing for enhancing bonding strength is performed prior to polishing or subsequent to polishing.

Then, the peripheral portion of the SOI substrate is formed. Specifically, as shown in FIG. 13E, the exposed surface of the semiconductor layer 38 is covered by an etching mask MK made of a sealing material, photoresist, or the like. The peripheral portion of the semiconductor layer 38 is removed by etching so that the edge of the semiconductor layer 38 for forming the SOI layer is brought to the position 31 shown in FIGS. 5 to 7. Further, the peripheral portion of the insulating layer 39 is also removed by etching or polishing.

Figure 13D:
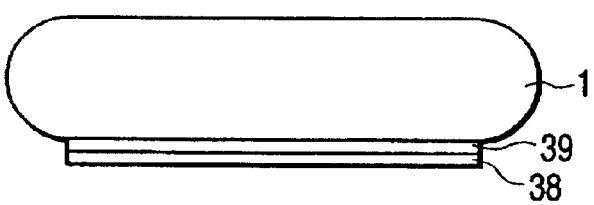
Figure 13E:
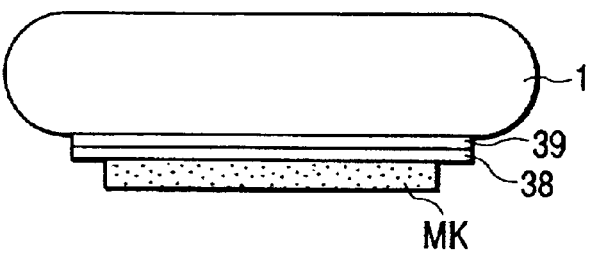
Figure 13F:
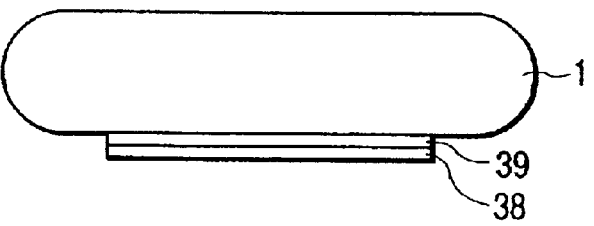

In such a manner, an SOI substrate is obtained as shown in FIG. 13F. The mark on the SOI substrate is formed at the position as shown in FIGS. 1, 2, 5 and 6.

After the step of FIG. 13C, the step of FIG. 13E may be conducted by omitting the step of FIG. 13D.

Embodiment 10

This Embodiment is conducted in the same manner as in Embodiment 9 except that the timing of the marking is changed, that is, the marking is conducted in a peripheral region on the front surface of the supporting substrate with using the mask MK in the covering state as shown in FIG. 13E before removal of the peripheral portion of the semiconductor layer 38.

Thus an SOI substrate is obtained as shown in FIG. 13F. The mark on the SOI substrate is formed at the position as shown in FIGS. 1, 2, 5 and 6. Otherwise the marking may be conducted on the back surface of the supporting substrate. In the case that polishing or cleaning can remove particles generated by marking, masking step is not required.

Embodiment 11

This Embodiment is conducted in the same manner as in Embodiment 9 except that the timing of the marking is changed, that is, the marking is conducted in a peripheral region on the front surface of the supporting substrate with using the mask MK in the covering state as shown in FIG. 13E after removal of the peripheral portion of the semiconductor layer 38 before removal of the mask MK.

Thus an SOI substrate is obtained as shown in FIG. 13F. The mark on the SOI substrate is formed at the position as shown in FIGS. 1, 2, 5 and 6. Otherwise the marking may be conducted on the back surface of the supporting substrate.

Embodiment 12

A process of producing a semiconductor substrate with a non-bonding method is explained with reference to FIGS. 14A to 14E and 15.

Figure 14A:
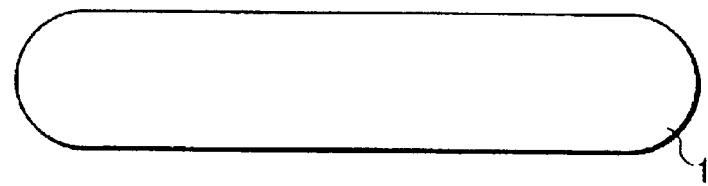
FIGS. 14A, 14B, 14C, 14D and 14E are sectional views explaining a production steps of a semiconductor substrate according to an embodiment of the present invention.
Figure 15:
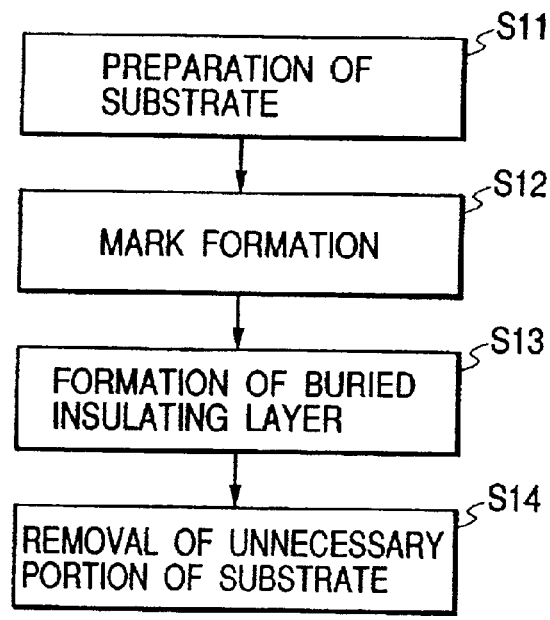
FIG. 15 is a flow chart of production steps of a semiconductor substrate according to an embodiment of the present invention.

In the step S11 of FIG. 15, a semiconductor substrate 1 such as a single-crystalline wafer is prepared as shown in FIG. 14A.

In the step S12 of FIG. 15, the marking is conducted on the peripheral region on the front surface side of the semiconductor substrate. Otherwise, the marking may be conducted on the back surface side of the semiconductor substrate.

Figure 14B:
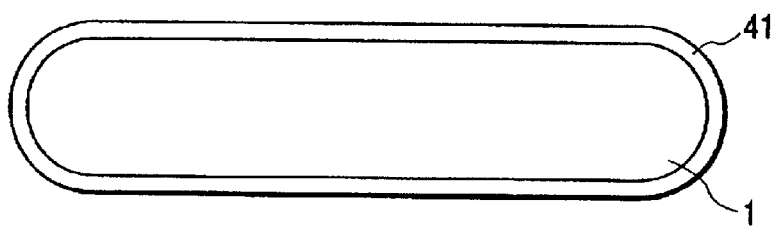

Then, the surface of the semiconductor substrate 1 is thermally oxidized to form an insulating layer 41 such as a silicon oxide layer, as shown in FIG. 14B.

Figure 14C:
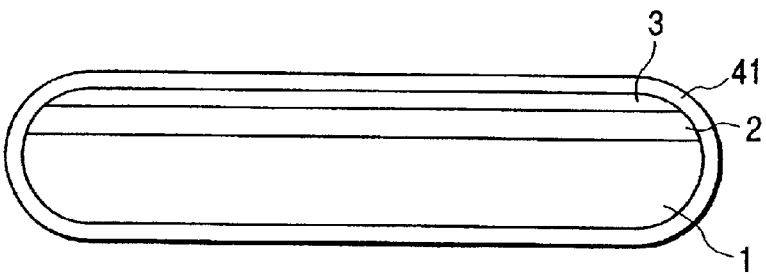

In the step S13 of FIG. 15, insulator-forming ions such as oxygen ions are implanted to a predetermined depth to form an ion-implanted layer where the concentration of the implanted ions is locally high. This substrate is heat-treated to form a buried insulating layer 2 composed of a compound of the implanted oxygen and silicon. The portion of the semiconductor layer 3 on this insulating layer 2 becomes an SOI layer. The resulting SOI substrate has a structure as shown in FIG. 14C.

In the step S14 of FIG. 15, the unnecessary portion of the insulating layer 41 at least on the surface side of the SOI layer is removed to obtain a marked SOI substrate. When the marking is conducted on the front side surface, the marked portion is also made to have the SOI structure having recessed and protruded portions by the ion implantation and the heat treatment after the marking, thereby enabling identification of the mark from the front surface side. In this case, the step of FIG. 14D need not be conducted.

As a modification of this Embodiment, the ion implantation may be conducted in a region excluding the marked portion to form a marked portion not having the SOI structure on the peripheral portion of the front surface side.

Embodiment 13

A process of producing a semiconductor substrate is explained with reference to FIGS. 14A to 14E and 16. This Embodiment is conducted in the same manner as in Embodiment 12 except that the timing of the marking is changed.

Figure 16:
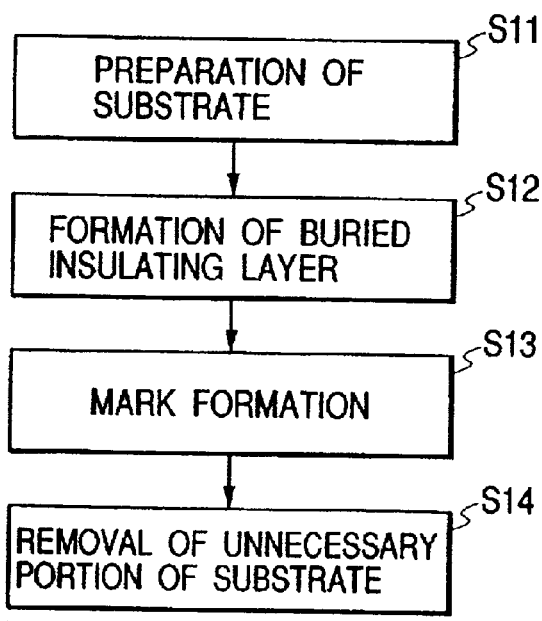
FIG. 16 is a flow chart of production steps of a semiconductor substrate according to an embodiment of the present invention.

In the step S11 of FIG. 16, a semiconductor substrate 1 such as a single-crystalline wafer is prepared as shown in FIG. 14A.

Then, the surface of the semiconductor substrate 1 is thermally oxidized to form an insulating layer 41 such as a silicon oxide layer as shown in FIG. 14B.

In the step S12 of FIG. 16, insulator-forming ions such as oxygen ions are implanted to the substrate in a predetermined depth to form an ion-implanted layer where the concentration of the implanted ions is locally high. This substrate is heat-treated to form a buried insulating layer 2 composed of a compound consisting of the implanted oxygen and silicon. The semiconductor layer 3 positioned on this insulating layer 2 becomes an SOI layer. The resulting SOI substrate has a structure as shown in FIG. 14C.

Figure 14D:
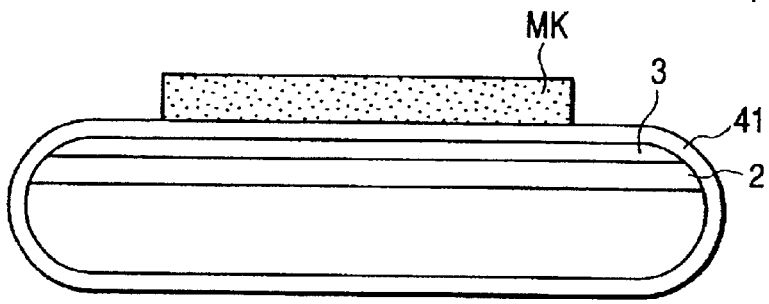

In the step S13 of FIG. 16, as shown in FIG. 14D, a mask MK is applied and, if necessary, the insulating layer 41 is removed, and the marking is conducted. The mark is formed such that the recessed portion of the mark reaches the lower portion of the insulating layer 2 through the semiconductor layer 3.

Figure 14E:
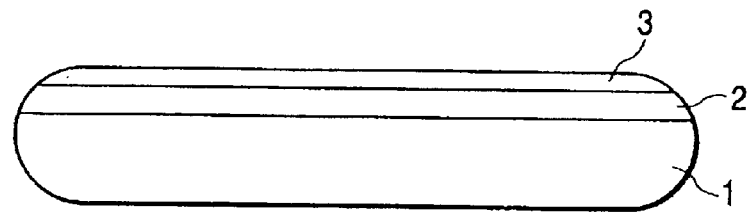

In the step S14 of FIG. 16, the mask MK and unnecessary insulating layer 41 are removed to obtain an SOI substrate as shown in FIG. 14E.

In this Embodiment, since the SOI layer is protected by the mask, even when splash of the particles is caused by laser marking, the soiling by splash of the particles can be prevented.

Embodiment 14

A process of producing a semiconductor substrate is explained with reference to FIG. 17. This Embodiment is conducted in the same manner as in Embodiment 13 except that the timing of the marking is changed.

Figure 17:
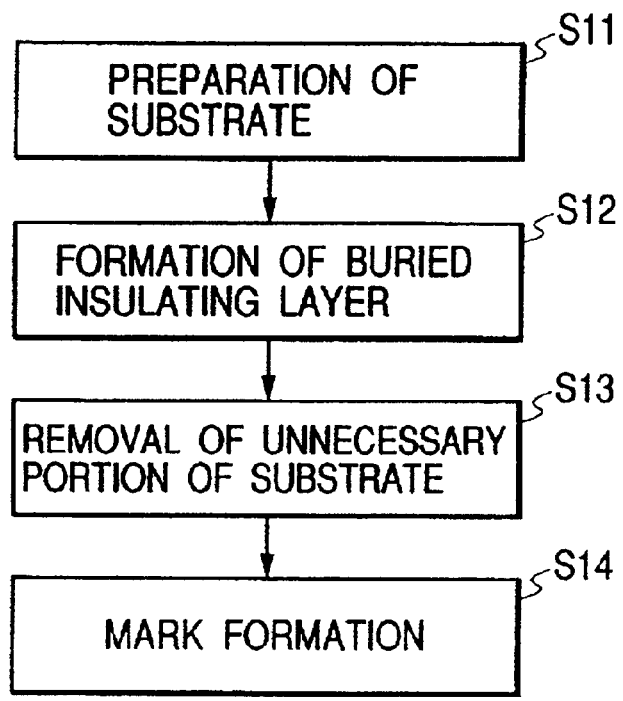
FIG. 17 is a flow chart of production steps of a semiconductor substrate according to an embodiment of the present invention.
Figure 18:
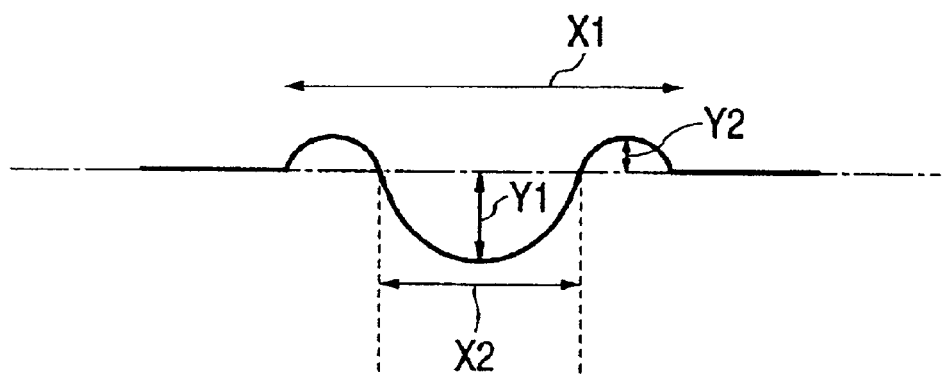
FIG. 18 is a cross-sectional view showing the shape of a laser mark.

The steps S11 and S12 of FIG. 17 are conducted in the same manner as in Embodiment 13.

In the step S13 of FIG. 17, the unnecessary insulating layer 41 is removed from the semiconductor as shown in FIG. 14E to obtain an SOI substrate.

In the step S14 of FIG. 17, the surface region of the semiconductor layer is covered with a mask, and the marking is conducted in the peripheral region on the front surface side of the SOI substrate. The mark is formed such that the recessed portion of the mark reaches the lower portion of the insulating layer 2 through the semiconductor layer 3.

In this Embodiment, since the SOI layer is protected by the mask, even when splash of the particles is caused by laser marking, the soiling by splash of the particles can be prevented.

Embodiment 15

A process of production of a bonding semiconductor substrate is explained with reference to FIGS. 8A to 8F.

A single-crystalline substrate of a P-type or N-type having a specific resistance of 0.01 Ω.cm is prepared as a first substrate. This substrate is anodized in an HF-containing solution to form a porous layer 37 as a separation layer.

The anodization conditions for forming the porous layer 37 consisting of porous silicon as a single layer are exemplified as below:

Current density: 7 (mA.cm$^{-2}$)
Anodization solution:
  Hydrofluoric acid:water:ethanol=1:1:1
Time: 11 (minutes)
Porous layer thickness: 12 ($\mu$m)

The thickness of the porous layer can be varied in the range from several hundred $\mu$m to about 0.1 $\mu$m by adjusting the anodization time.

In formation of porous layer constituted of plural porous silicon layers, the first step and the second step of the anodization may be conducted under the conditions as below:

First step
  Current density: 7 (mA.cm$^{-2}$)
  Anodization solution:
    Hydrofluoric acid:water:ethanol=1:1:1
  Time: 5 (minutes)
  First porous layer thickness: 5.5 ($\mu$m)
Second step
  Current density: 30 (mA.cm$^{-2}$)
  Anodization solution:
    Hydrofluoric acid:water:ethanol=1:1:1
  Time: 10 (seconds)
  Second porous layer thickness: 0.2 ($\mu$m)

The first porous silicon layer formed firstly as the surface layer by anodization at a lower current density is employed for formation of a high-quality epitaxial Si layer, and the second porous silicon layer formed secondly as the lower layer by anodization at a higher current density is employed for facilitating the separation, the two porous layers having different functions. Therefore, the thickness of the porous Si layer formed is not limited to the above, but may range from several hundred $\mu$m to about 0.1 $\mu$m. In addition to the above two layers, third layer or more layers may be formed thereon.

This substrate is oxidized at 300 to 600° C. in an oxygen atmosphere to cover the inside walls of the holes of the porous silicon with a protection film composed of a thermal oxidation film. The surface of the porous layer 37 is treated with hydrofluoric acid to remove only the oxide film on the surface of the porous layer 37 while the oxide film on the inside walls of the holes is kept unremoved. On the porous silicon, single-crystalline silicon is grown epitaxially by CVD (chemical vapor deposition). The growth conditions are shown below.

| | |
|---|---|
| Source gas: | SiH$_2$Cl$_2$/H$_2$ |
| Gas flow rate: | 0.5/180 L/min |
| Gas pressure: | 1.1 × 10$^4$ Pa (about 80 Torr) |
| Temperature: | 950° C. |
| Growth rate: | 0.3 $\mu$m/min |

Prior to the epitaxial growth, the porous layer 37 is heat-treated (prebaked) in a hydrogen atmosphere in the epitaxial growth chamber. This heat treatment is necessary for improving the quality of the crystal of an epitaxial growth layer 38. Actually, the crystal defects of the epitaxial growth layer 38 can be decreased to not more than 10$^4$ cm$^{-2}$. The resulting epitaxial growth layer 38 is employed later as the transferred layer.

On the surface of this epitaxial growth layer, an SiO$_2$ layer of 20 nm to 2 $\mu$m thick is formed as an insulating layer 39 by thermal oxidation. Thus the structure is obtained as shown in FIG. 8A.

The surface of the insulating layer 39 and a surface of a separately prepared second Si substrate are brought into contact with each other, and the contacted substrates are heat-treated at a temperature of 1100° C. for 2 hours to cause bonding of the substrates, whereby the structure as shown in FIG. 8B is obtained.

From the resulting multilayered structure, the porous layer 37 is removed to obtain an SOI substrate which comprises the second substrate 1 and the epitaxial growth layer 38 transferred thereon. For this, the portion 36 of the first Si substrate is removed by grinding, polishing, etching or the like to expose the porous layer 37, and then the porous layer 37 is removed by etching. Otherwise, the multilayered structure is separated at the porous layer 37, and if the porous portion remains on the separation face of the epitaxial growth layer 38 transferred onto the second substrate 1, the porous portion is removed by etching, hydrogen annealing or the like.

The substrate separation method includes a method of inserting a wedge between the substrates; a method of pulling the substrates opposite; a method of applying a shearing force; a method of utilizing the effect of a fluid wedge such as water jet, gas jet, and static pressure fluid; a method of applying ultrasonic wave; a method of applying a thermal stress by heating and cooling. Thus a structure is obtained as shown in FIG. 8C.

Thereafter, the porous Si layer 37 remaining on the second substrate 1 is selectively etched by a liquid mixture composed of hydrofluoric acid, hydrogen peroxide and water. The semiconductor layer 38 composed of nonporous single-crystalline silicon remains unetched. This layer 38 functions as an etch-stopping material, thereby allowing complete removal of the porous Si by selective etching. Thus a structure is obtained as shown in FIG. 8D.

The etching rate of the nonporous Si single-crystal in the above-mentioned etching liquid mixture is extremely low: the selectivity ratio of etching rate of a porous layer relative to the etching rate of a nonporous layer reaches as high as 10$^5$ or more, and therefore the thickness decrease of the nonporous layer by etching (about several ten angstroms) is negligible practically.

Thus the semiconductor layer 38 of 0.2 $\mu$m thick constituted of single-crystalline Si is formed on the insulating layer 39. The single-crystalline Si layer does not change at all by the selective etching of the porous Si. The thickness of the formed semiconductor layer 38 had uniformity in the range of 201 nm±4 nm in measurement at 100 points over the entire surface.

No additional crystal defect is observed in the Si layer according to transmission electron microscopy.

The surface can be made flat by heat treatment at 1100° C. in a hydrogen atmosphere.

The oxide film may be formed on the surface of the second substrate, in place of the epitaxial growth layer, to obtain the same results.

A mask MK is applied to cover the surface region of the semiconductor layer 38, and a part of the semiconductor layer 38 and a part of the insulating layer 39 on the peripheral region of 1 to 3 mm wide inward from the outer peripheral edge are removed by patterning to correct the shape of the peripheral portion. This treatment of periphery patterning may be omitted.

On the peripheral region, near the notch or the orientation flat portion, a predetermined number of digits of alphanumeric characters, symbols, or bar cords are recorded by a laser marking apparatus. The recorded characters need not meet the SEMI Standard. The size of the character can be adjusted by about 0.8 mm-pitch with a usual laser marking apparatus, and may be smaller, or larger for easy reading.

The aforementioned heat treatment in hydrogen atmosphere (hydrogen annealing) for surface flattening may be conducted after this laser marking.

Thereafter, the mask MK is removed, and the SOI substrate is cleaned, inspected, packed up, and shipped.

The porous Si remaining on the side of the substrate portion 36 of the first substrate is selectively etched with stirring in a liquid mixture of hydrofluoric acid, hydrogen peroxide and water. The surface of this etched substrate is subjected to hydrogen annealing, surface polishing, or a like treatment. The treated substrate can be reused as the first substrate 30 or the second substrate 1.

Embodiment 16

A process for producing a bonding semiconductor substrate is explained which employs an ion-implanted layer as a separation layer, with reference to FIGS. 13A to 13F.

On a first substrate 30 such as a single-crystalline Si wafer, an insulating layer 39 composed of $SiO_2$ of 200 nm thick is formed by thermal oxidation.

Through the insulating surface layer 39, hydrogen cations are implanted at a power level of 50 keV at a density of $5 \times 10^{16}$ $cm^{-2}$. The hydrogen ions may be replaced by ions of an inert gas such as helium. Thereby a structure is obtained as shown in FIG. 13A. The surface of the insulating layer and the surface of a separately prepared second substrate such as a single-crystalline Si wafer are brought in superposition and contact with each other. Thereby a structure is obtained as shown in FIG. 13B.

The resulting structure is annealed at 600° C., whereby it is separated into two pieces near the projection range of ion implantation (ion-implanted layer 40). The ion-implanted layer 40, which causes the separation by heat treatment, is in a porous state. Therefore, the separation surfaces are rough. At least, the surface of the side of the second substrate 1 is smoothened by polishing, or hydrogen annealing. Thereby, a structure is obtained as shown in FIG. 13C or 13D. It is prefer that bonding anneal is performed prior to smoothing step or subsequent to smoothing step.

Thus the semiconductor layer 38 of 0.2 μm thick constituted of single-crystalline Si is formed on the insulating layer 39. The thickness of the formed semiconductor layer 38 had uniformity in the range of 201 nm±6 nm in thickness measurement at 100 points over the entire surface.

Further, a heat treatment is conducted at 1100° C. in a hydrogen atmosphere for one hour. By observation with an atomic force microscope, the surface roughness is about 0.2 nm in terms of mean square roughness in a region of 50 μm square, which is comparable with an ordinary commercial single-crystalline Si mirror wafer.

No additional crystal defect is observed in the semiconductor layer 38 by transmission electron microscopy, and the excellent crystallinity is confirmed to be maintained.

A mask MK is applied to cover the surface but to expose a part of the semiconductor layer 38 and a part of the insulating layer 39 in the peripheral region of 1 to 3 mm wide inward from the outer peripheral edge, and the exposed parts are removed by patterning to correct the shape of the peripheral portion as shown in FIG. 13F.

On the peripheral 3 mm-region, near the notch or the orientation flat portion, 12 digits of alphanumeric characters are recorded by a laser marking apparatus. As mentioned before, the mark may be a symbol or a bar code. In the marking operation, no particle is deposited on SOI wafer. The laser power therefor is adjusted to about 220 mW. A range of laser power is adjusted depending on mark depth or mark size.

The size of the alphanumeric characters is selected to meet the aforementioned SEMI Standard. The size of the character can be adjusted by a 0.8 mm-pitch with a usual laser marking apparatus, and may be smaller, or larger for easy reading.

Thereafter, the mask MK is removed, and the SOI substrate is cleaned, inspected, packed up, and shipped. Optionally, smoothing step is performed subsequent to marking step.

The ion-implanted layer remaining on the side of the substrate portion 36 of the first substrate is removed and the substrate surface is flattened at least by etching, polishing, or annealing. The treated substrate is can be reused as the first substrate 30 or the second substrate 1.

In a modification of this Embodiment, single-crystalline Si is epitaxially grown in a thickness of 0.50 μm preliminarily on the first substrate by CVD. The growth conditions are as below.

| | |
|---|---|
| Source gas: | $SiH_2Cl_2/H_2$ |
| Gas flow rate: | 0.5/180 L/min |
| Gas pressure: | $1.1 \times 10^4$ Pa (about 80 Torr) |
| Temperature: | 950° C. |
| Growth rate: | 0.30 μm/min |

For reuse of the first substrate, the wafer thickness decrease can be compensated by epitaxial growth as above, which enables semipermanent reuse of the substrate. That is, the second or later epitaxial growth is conducted to supplement the lost thickness of the wafer, not 50 μm, and the ion-implanted layer is formed in the epitaxially grown layer.

Further, similarly as in Embodiment 16, after the ion implantation, the separation of the bonded substrates is conducted by applying an external force to allow cracking from the edge of the bonded substrates without heat treatment.

Embodiment 17

Production of a semiconductor substrate by a non-bonding method is explained with reference to FIGS. 14A to 14E.

A first single-crystalline 8 inch CZ—Si wafer is prepared as the substrate 1. Thereon an oxide film 41 composed of $SiO_2$ is formed in a thickness of 50 nm by thermal oxidation as shown in FIGS. 14A and 14B. This oxide film is provided to prevent roughening of the surface on ion implantation. Therefore, this oxidation film may be omitted.

Through the oxide film 41 on the surface, O+ ions are implanted at a density of $4 \times 10^7$ cm$^{-2}$ at a power level of 180 keV at a temperature of 550° C. Thereby, an oxygen ion-implanted layer is formed with a concentration peak in the vicinity of the interface between the epitaxial growth layer and the original substrate. Nitrogen ions may be implanted in addition to or in place of the oxygen ions.

This substrate is heat-treated at 1350° C. in an atmosphere of O$_2$(10%)/Ar for 4 hours to obtain an SOI substrate having an 300 nm SOI layer/90 nm buried oxide film as shown in FIG. 14C.

Then, the substrate is further heat-treated at 1350° C. in an atmosphere of O$_2$(70%)/Ar for 4 hours to obtain an SOI wafer having an 200 nm SOI layer/120 nm buried oxide film.

A mask MK is applied onto the surface of the semiconductor layer 3 (FIG. 14D). The mask has an aperture of 2.8 mm wide and 18.5 mm long represented by an X-Y coordinate:

X: −9.25 mm to +9.25 mm

Y: +93.7 mm to +96.5 mm taking the center of the wafer as the origin (0,0) with the notch of the substrate directed upward, for exposing the underlying supporting substrate. From the unmasked portion, a portion of the semiconductor layer 3 and a portion of the insulating layer 2 are removed by patterning-etching With the mask kept covering the surface region of the semiconductor layer 3, an ID code of 10 digits is recorded on the recording region by a laser marking apparatus. The laser power is adjusted to 220 mW, and the size of the alphanumerical characters is selected in accordance with the SEMI Standard. The size of the character is adjustable by about 0.8 mm-pitch. The size may be smaller, or may be larger for ease of reading. The size of the region of the SOI structure removal may be changed in accordance with the size of the recorded character. In particular, when smaller characters are used, the region of the SOI structure removal is made smaller to decrease the unused removal region and to increase the number of the produced chips. For special uses, the substrate need not meet the SEMI Standard. The mask MK is removed, and the surface oxide film 41 is removed to obtain the SOI wafer in FIG. 14E, which may be further annealed in hydrogen.

Thereafter, the substrate is cleaned, inspected, packed up, and shipped.

The marking means applicable to the above-described embodiments of the present invention includes lasers such as Nd:YAG laser, and CO$_2$ laser; and use of a diamond pen. After formation of the mark, the protruded portions formed in the marked region may be removed by grinding or a suitable method at an appropriate time. In the embodiments, the particle removing step after marking enables to perform marking without mask. The particle removing step comprises at least one of wet-cleaning, blush-cleaning, scrubbing, supersonic wave cleaning, polishing, or etching.

EXAMPLE 1

In a commercially available 8 inch SOI wafer, a part of the semiconductor layer 3 and a part of the insulating layer 2 were removed by etching from the region represented by X-Y coordinate:

X: −9.25 mm to +9.25 mm

Y: +93.7 mm to +96.5 mm taking the center of the wafer as the origin (0,0) with the notch of the substrate directed upward, the region having a width L2 of 2.8 mm and a length L1 of 18.5 mm (a portion other than an edge extrusion portion), to expose the underlying supporting substrate.

On the exposed region 14, an ID code of 10 digits was recorded by a laser marker SL47 (manufactured by NEC Co.). The laser power was 220 mW. The size of the alphanumerical characters was

| | |
|---|---|
| Height: | 1.624 ± 0.025 mm |
| Breadth: | 0.812 ± 0.025 mm |
| Line boldness: | 0.200 + 0.050 mm to 0.200−0.150 mm |
| Character interval: | 1.420 ± 0.025 mm | in accordance with the SEMI Standard.

The size of the character can be adjusted by about 0.8 mm-pitch, and may be smaller, or larger for easy reading. When smaller characters are used, the region of the SOI structure removal is made smaller to decrease the unnecessary removal and to increase the number of the produced chips.

EXAMPLE 2

In the peripheral region 13 of a commercially available bonding SOI wafer where the underlying supporting substrate is exposed, an ID code of 12 digits was recorded by a laser marking apparatus. The 12-digit characters were arranged in a line. The laser power was 220 mW. The size of the alphanumerical characters was

| | |
|---|---|
| Height: | 1.624 ± 0.025 mm |
| Breadth: | 0.812 ± 0.025 mm |
| Line boldness: | 0.200 + 0.050 mm to 0.200−0.150 mm |
| Character interval: | 1.420 ± 0.025 mm | in accordance with the SEMI Standard.

The size of the character can be adjusted by about 0.8 mm-pitch, and may be smaller, or larger for easy reading. When the breadth of the peripheral removal region is small, smaller characters are preferred.

EXAMPLE 3

In a peripheral region of a commercially available SOI wafer where the supporting substrate was covered only by an oxide film, an ID code of 12 digits was recorded by a laser marking apparatus. The laser power was adjusted to 300 mW. The recessed portion caused by the laser penetrated through the oxide film and reached the supporting substrate. The size of the alphanumerical characters was

| | |
|---|---|
| Height: | 1.624 ± 0.025 mm |
| Breadth: | 0.812 ± 0.025 mm |
| Line boldness: | 0.200 + 0.050 mm to 0.200−0.150 mm |
| Character interval: | 1.420 ± 0.025 mm | in accordance with the SEMI Standard.

The size of the character can be adjusted by about 0.8 mm-pitch, and may be smaller, or larger for easy reading. When the peripheral removal region is narrow, smaller characters are preferred.

For special uses, the SEMI Standard need not be applied.

EXAMPLE 4

A first single-crystalline Si substrate having a specific resistance of 0.01 Ω.cm was anodized in an HF solution. The anodization conditions were as below.

| | |
|---|---|
| Current density: | 7 (mA · cm$^{-2}$) |
| Anodization solution: | Hydrofluoric acid:water:ethanol = 1:1:1 |
| Time: | 11 (minutes) |
| Porous Si thickness: | 12 (μm) |

The thickness of the porous layer is not limited thereto and may be varied in the range from several hundred μm to about 0.1 μm.

This substrate was oxidized at 400° C. in an oxygen atmosphere to cover the inside walls of the pores of the porous silicon with a thermal oxidation film. The surface of the porous Si layer was treated with hydrofluoric acid to remove the oxide film from only the surface of the porous Si layer while the oxide film on the inside walls of the pores was kept unremoved. On the porous Si, single-crystalline Si is grown epitaxially by CVD in a thickness of 0.3 μm. The growth conditions were shown below.

| | |
|---|---|
| Source gas: | SiH$_2$Cl$_2$/H$_2$ |
| Gas flow rate: | 0.5/180 L/min |
| Gas pressure: | 1.1 × 10$^4$ Pa (about 80 Torr) |
| Temperature: | 950° C. |
| Growth rate: | 0.3 μm/min |

Prior to the epitaxial growth by introduction of the source gas, the substrate was heat-treated (prebaked) in a hydrogen atmosphere in the epitaxial growth chamber.

On the surface of this epitaxial Si layer, an oxide film (SiO$_2$ layer) of 200 nm was formed by thermal oxidation.

The surface of resulting the SiO$_2$ layer and the surface of a separately prepared second Si substrate were brought into contact with each other, and the contacted substrates were heat-treated at a temperature of 1100° C. for 2 hours to bond the two substrates.

Most portion of the first substrate side of the bonded substrates was removed by grinding, and the remaining portion was removed by reactive ion etching to expose the porous Si layer.

The porous Si layer transferred to the second substrate was etched by a mixture of 49 wt % hydrofluoric acid, aqueous 30 wt % hydrogen peroxide and water with stirring. The single-crystalline Si was remained unetched, while the porous Si was completely removed by selective etching.

Thus a single-crystalline Si layer of 0.2 μm thick was formed on the Si oxide film. No change was caused in the single-crystalline Si layer by selective etching of the porous Si. The thickness of the formed single-crystalline Si layer had uniformity in the range of 201 nm±4 nm in thickness measurement at 100 points over the entire surface.

No additional crystal defect was observed in the Si layer by transmission electron microscopy, and the excellent crystallinity was confirmed to be maintained.

Further, a heat treatment was conducted at 1100° C. in a hydrogen atmosphere for one hour. By observation with an atomic force microscope, the surface roughness was about 0.2 mn in terms of mean square roughness in a region of 50 μm square, which was equal to the surface roughness of an ordinary commercial Si wafer.

Then the Si layer and the SiO$_2$ layer in the peripheral region of 3 mm in width inward from the outer peripheral edge were removed by patterning to correct the shape of the peripheral portion.

On the peripheral 3 mm-region, near the notch portion, 12-digit alphanumeric characters were recorded by a laser marking apparatus. No increase of deposited particles was observed on SOI wafer.

EXAMPLE 5

A first single-crystalline Si substrate of a P-type having a specific resistance of 0.01 Ω.cm was anodized in an HF solution. The anodization conditions were as below:

First stage

| | |
|---|---|
| Current density: | 7 (mA · cm$^{-2}$) |
| Anodization solution: | Hydrofluoric acid:water:ethanol = 1:1:1 |
| Time: | 5 (minutes) |
| First porous layer thickness: | 5.5 (μm) |

Second stage

| | |
|---|---|
| Current density: | 30 (mA · cm$^{-2}$) |
| Anodization solution: | Hydrofluoric acid:water:ethanol = 1:1:1 |
| Time: | 10 (seconds) |
| Second porous layer thickness: | 0.2 (μm) |

This substrate was oxidized at 400° C. for one hour in an oxygen atmosphere to cover the inside walls of the pores of the porous silicon with a thermal oxidation film. The surface of the porous Si layer was treated with hydrofluoric acid to remove the oxide film from only the surface of the porous layer while the oxide film on the inside walls of the pores was kept unremoved. On the porous silicon, single-crystalline silicon was grown epitaxially by CVD (chemical vapor deposition) in a thickness of 0.3 μm. The growth conditions were shown below.

| | |
|---|---|
| Source gas: | SiH$_2$Cl$_2$/H$_2$ |
| Gas flow rate: | 0.5/180 L/min |
| Gas pressure: | 1.1 × 10$^4$ Pa (about 80 Torr) |
| Temperature: | 950° C. |
| Growth rate: | 0.3 μm/min |

Prior to the epitaxial growth, the substrate was heat-treated in a hydrogen atmosphere in the epitaxial growth chamber. By this heat treatment, the crystal defects in the epitaxially grown layer were decreased to not more than 10$^4$ cm$^{-2}$.

On the surface of this epitaxial Si layer, an oxide film (SiO$_2$ layer) of 200 nm thick was formed as an insulating layer by thermal oxidation.

The surface of the resulting SiO$_2$ layer and the surface of a separately prepared second Si substrate were brought into contact and superposition with each other, and the superposed substrates were heat-treated at a temperature of 1100° C. for 2 hours to cause bonding.

The above bonded substrates were separated at the porous Si layer by solid wedge insertion and water wedge insertion by water-jet.

The porous Si layer transferred to the second substrate was etched selectively by a mixture of 49 wt % hydrofluoric acid, aqueous 30 wt % hydrogen peroxide and water with stirring.

Thus a single-crystalline Si layer of 0.2 μm thick was formed on the Si oxide film. No change was caused in the single-crystalline Si layer by the selective etching of the porous Si. The thickness of the formed single-crystalline Si layer had uniformity in the range of 201 nm±4 nm in thickness measurement at 100 points over the entire surface. No additional crystal defect was observed in the Si layer by transmission electron microscopy, and the excellent crystallinity was confirmed to be maintained.

Further, a heat treatment was conducted at 1100° C. in a hydrogen atmosphere for one hour. By observation with an atomic force microscope, the surface roughness was about 0.2 mn in terms of mean square roughness in a region of 50 $\mu$m square, which was equal to the surface roughness of an ordinary commercial Si wafer.

Then the Si layer and the $SiO_2$ layer in the peripheral region of 2.5 mm in width inward from the outer peripheral edge were removed by patterning to correct the shape of the peripheral portion.

On the peripheral region, near the notch portion, 12-digit alphanumeric characters were recorded by a laser marking apparatus. No increase of deposited particles was observed on the SOI wafer. The laser power was 220 mW. The size of the alphanumerical characters was

| | |
|---|---|
| Height: | 1.624 ± 0.025 mm |
| Breadth: | 0.812 ± 0.025 mm |
| Line boldness: | 0.200 + 0.050 mm to 0.200–0.150 mm |
| Character interval: | 1.420 ± 0.025 mm | in accordance with the SEMI Standard.

The porous Si remaining on the first substrate side was selectively etched by the aforementioned liquid mixture of hydrofluoric acid, hydrogen peroxide and water. The substrate was annealed with hydrogen. Thereby the substrate was made reusable as the first substrate or the second substrate.

EXAMPLE 6

A first single-crystalline Si substrate of a P-type having a specific resistance of 0.01 $\Omega$.cm was anodized in an HF solution. The anodization conditions were as below:

First stage

| | |
|---|---|
| Current density: | 7 (mA · cm$^{-2}$) |
| Anodization solution: | Hydrofluoric acid:water:ethanol = 1:1:1 |
| Time: | 5 (minutes) |
| First porous layer thickness: | 5.5 ($\mu$m) |

Second stage

| | |
|---|---|
| Current density: | 30 (mA · cm$^{-2}$) |
| Anodization solution: | Hydrofluoric acid:water:ethanol = 1:1:1 |
| Time: | 10 (seconds) |
| Second porous layer thickness: | 0.2 ($\mu$m) |

This substrate was oxidized at 400° C. for one hour in an oxygen atmosphere to cover the inside walls of the pores of the porous silicon with a thermal oxidation film. The surface of the porous Si layer was treated with hydrofluoric acid to remove the oxide film from only the surface of the porous layer while the oxide film on the inside walls of the pores was kept unremoved. On the porous silicon, single-crystalline silicon was grown epitaxially by CVD in a thickness of 0.3 $\mu$m. The growth conditions were shown below.

| | |
|---|---|
| Source gas: | $SiH_2Cl_2/H_2$ |
| Gas flow rate: | 0.5/180 L/min |
| Gas pressure: | 1.1 × 10$^4$ Pa (about 80 Torr) |
| Temperature: | 950° C. |
| Growth rate: | 0.3 $\mu$m/min |

Prior to the epitaxial growth, the substrate was heat-treated in a hydrogen atmosphere in the epitaxial growth chamber. By this heat treatment, the crystal defects of the epitaxially grown layer were decreased to not more than $10^4$ cm$^{-2}$.

On the surface of this epitaxial growth layer, an oxide film ($SiO_2$ layer) of 200 nm thick was formed as an insulating layer by thermal oxidation.

Another Si substrate was prepared. On a portion which would be present outside the contact edge on the peripheral portion of this substrate near the notch, that is, on the surface of peripheral portion of the Si substrate slightly inclined by beveling, alphanumerical characters of 12 digits were recorded by a laser marking apparatus. The laser power was 220 mW. The size of the alphanumerical characters was

| | |
|---|---|
| Height: | 1.624 ± 0.025 mm |
| Breadth: | 0.812 ± 0.025 mm |
| Line boldness: | 0.200 + 0.050 mm to 0.200–0.150 mm |
| Character interval: | 1.420 ± 0.025 mm | in accordance with the SEMI Standard.

The substrate after the laser marking was cleaned.

The surface of the $SiO_2$ layer of the first substrate and the surface of the marked second Si substrate were brought into contact with each other, and were heat-treated at 1100° C. for 2 hours for bonding. According to analysis, the bonding was found not to be caused at the marked portion.

The above bonded substrates were separated at the interior of the porous Si layer by solid wedge insertion and water wedge insertion by water-jet.

The porous Si layer transferred to the second substrate was etched selectively by a mixture of 49 wt % hydrofluoric acid, aqueous 30 wt % hydrogen peroxide and water with stirring.

Thus a single-crystalline Si layer of 0.2 $\mu$m thick was formed on the Si oxide film. No change was caused in the single-crystalline Si layer by the selective etching of the porous Si. The thickness of the formed single-crystalline Si layer had uniformity in the range of 201 nm±4 nm in thickness measurement at 100 points over the entire surface.

No additional crystal defect was observed in the Si layer by transmission electron microscopy, and the excellent crystallinity was confirmed to be maintained.

Further, a heat treatment was conducted at 1100° C. in a hydrogen atmosphere for one hour. By observation with an atomic force microscope, the surface roughness was about 0.2 mn in terms of mean square roughness in a region of 50 $\mu$m square, which was equal to the surface roughness of an ordinary commercial Si wafer.

Then the SOI layer in the peripheral region of 2.5 mm in width inward from the outer peripheral edge, and $SiO_2$ in the peripheral region of 2.3 mm in width inward from the outer peripheral edge were removed by patterning to correct the shape of the peripheral portion.

Since the marked portion had not been bonded, the marked portion was hardly deformed in the steps of separation, etching, and so forth.

As described above in detail, in each of Examples, the particle generation is retarded since the mark is formed by laser marking on the region which does not have an SOI multilayer structure. Further, the laser power need not be adjusted for optimization for the SOI layer combination, regardless of the SOI layer structure.

The particle generation is one of the main causes of drop of the device production yield. In particular, under the rule of not more than 0.1 μm at present, even slightest particle generation or a smallest particle generation is not acceptable. In such a circumstance, particle generation can be prevented to a certain extent by adjusting the laser power and other conditions in accordance with the SOI layer thickness constitution. However, this decreases the production yield in mass production. Therefore, if the marking can be conducted under fixed conditions regardless of the SOI film thickness constitution, the particle increase can be made minimum.

The present invention provides a semiconductor substrate which facilitates the reading of the ID mark and causes less deposition of splashed particles, and on which the marking of the ID is easily conducted.

In the above-mentioned embodiments or examples, it may be employed any conditions as below:

1) bonding anneal;
   atmosphere/$O_2$, $N_2$, temperature/400° C. to 1100° C., 2 steps annealing,
2) prebonding treatment;
   nitrogen plasma treatment and pure water rinsing,
3) anodization;
   HF solution with ethanol or isopropanol,
4) $H_2$ annealing;
   temperature/800° C. to 1150° C. or more,
5) Marking;
   adjusting/laser power, shot counts, pulse width, beam diameter, dot diameter, dot depth, etc. Depth of the mark/1 μm to 400 μm.

The present invention may be embodied in other specific forms without departing from the spirit or essential characteristics thereof. The present examples are therefore to be considered in all respects as illustrative and not restrictive, the scope of the present invention being indicated by the appended claims rather than by the foregoing description and all changes which come within the meaning and range of equivalency of the claims are therefore intended to be embraced therein.

What is claimed is:

1. A semiconductor substrate comprising a semiconductor layer formed on a supporting substrate with interposition of an insulating layer therebetween,
   wherein a mark for identification of the semiconductor substrate is formed on a bevelled surface of the peripheral region of the supporting substrate at which the semiconductor layer is not present, and
   wherein the semiconductor substrate is a bonding SOI substrate, and the mark is formed on the surface where bonding is not conducted.

2. A semiconductor substrate comprising a semiconductor layer formed on a supporting substrate with interposition of an insulating layer therebetween,
   wherein a mark for identification of the semiconductor substrate is formed on a bevelled surface of the peripheral region of the supporting substrate at which the semiconductor layer is not present, and
   wherein the semiconductor substrate is a bonding SOI substrate, and the mark is formed on the surface outside a position corresponding to a contact edge.

3. A semiconductor substrate comprising a semiconductor layer formed on a supporting substrate with interposition of an insulating layer therebetween,
   wherein a mark for identification of the semiconductor substrate is formed on a bevelled surface of the peripheral region of the supporting substrate at which the semiconductor layer is not present, and
   wherein the semiconductor substrate is a bonding SOI substrate, and the mark is formed on the surface outside a position corresponding to a contact edge or a bonding edge.

4. A semiconductor substrate comprising a semiconductor layer formed on a supporting substrate with interpositon of an insulating layer therebetween,
   wherein a mark for identification of the semiconductor substrate is formed on a bevelled surface of a peripheral region of the supporting substrate at which the semiconductor layer is not present, and wherein the semiconductor substrate is a bonding SOI substrate.

5. A semiconductor substrate comprising a semiconductor layer formed on a supporting substrate with interposition of an insulating layer therebetween,
   wherein a mark for identification of the semiconductor substrate is formed on a bevelled surface of a peripheral region of the supporting substrate.

* * * * *

UNITED STATES PATENT AND TRADEMARK OFFICE
CERTIFICATE OF CORRECTION

PATENT NO. : 6,953,948 B2
APPLICATION NO. : 10/178361
DATED : October 11, 2005
INVENTOR(S) : Kiyofumi Sakaguchi It is certified that error appears in the above-identified patent and that said Letters Patent is hereby corrected as shown below:

ON COVER PAGE AT (62) RELATED U.S. APPLICATION DATA

Insert: "Division of application No. 07/749,730," should read --Division of application No. 09/749,730,--.

COLUMN 1

Line 55, "example" should read --examples--; and
Line 61, "patent" should read --patents--.

COLUMN 2

Line 26, "be" should be deleted--;
Line 29, "Shallow" should read --A shallow--;
Line 30, "low" should read --a low--; "High" should read --A high--; "mark" should read --marks--; and
Line 63, "seriously." should read --serious.--.

COLUMN 4

Line 28, "a production" should read --production--; and
Line 56, "is" should read --are--.

COLUMN 5

Line 19, "detects" should read --defects--.

COLUMN 6

Line 19, "the" should be deleted; and
Line 35, "substrate" should read --substrates--.

COLUMN 7

Line 42, "other" should read --another--.

COLUMN 8

Line 6, "is" should read --are--.

UNITED STATES PATENT AND TRADEMARK OFFICE
CERTIFICATE OF CORRECTION

PATENT NO. : 6,953,948 B2
APPLICATION NO. : 10/178361
DATED : October 11, 2005
INVENTOR(S) : Kiyofumi Sakaguchi It is certified that error appears in the above-identified patent and that said Letters Patent is hereby corrected as shown below:

COLUMN 13

Line 29, "porous" should read --a porous--; and
    Line 56, "third" should read --a third--.

COLUMN 14

Line 56, "etching" should read --the etching--.

COLUMN 15

Line 17, "cords" should read --codes--;
    Line 58, "prefer" should read --preferred--; and "anneal" should read --annealing--.

COLUMN 16

Line 32, "is" should be deleted--.

COLUMN 17

Line 28, "patterning-etching" should read --patterning-etching.--; and
    Line 29, "kept" should be deleted.

COLUMN 19

Line 49, "was" should be deleted.

Signed and Sealed this

First Day of August, 2006

JON W. DUDAS
*Director of the United States Patent and Trademark Office*